US011894495B2

(12) United States Patent
Cheng et al.

(10) Patent No.: US 11,894,495 B2
(45) Date of Patent: Feb. 6, 2024

(54) MICRO LED STRUCTURE AND DISPLAY DEVICE

(71) Applicant: Lextar Electronics Corporation, Hsinchu (TW)

(72) Inventors: Kai-Hung Cheng, Hsinchu (TW); Fu-Han Ho, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 240 days.

(21) Appl. No.: 17/337,370

(22) Filed: Jun. 2, 2021

(65) Prior Publication Data
US 2022/0393078 A1    Dec. 8, 2022

(51) Int. Cl.
| | |
|---|---|
| H01L 33/48 | (2010.01) |
| H01L 33/10 | (2010.01) |
| H01L 33/46 | (2010.01) |
| H01L 33/60 | (2010.01) |
| H01L 33/62 | (2010.01) |
| H01L 33/58 | (2010.01) |
| H01L 25/075 | (2006.01) |

(52) U.S. Cl.
CPC ............ *H01L 33/486* (2013.01); *H01L 33/10* (2013.01); *H01L 33/46* (2013.01); *H01L 33/60* (2013.01); *H01L 33/62* (2013.01)

(58) Field of Classification Search
CPC ......... H01L 33/10; H01L 33/46; H01L 33/60; H01L 33/486; H01L 33/58; H01L 33/62; H01L 25/0753; H05B 33/20; H05B 33/22; H05B 33/10; H05B 33/12
See application file for complete search history.

(56) References Cited

U.S. PATENT DOCUMENTS

| | | | |
|---|---|---|---|
| 9,537,069 B1 | 1/2017 | Bower et al. | |
| 10,193,025 B2 | 1/2019 | Bower et al. | |
| 2015/0362165 A1 | 12/2015 | Chu et al. | |
| 2018/0119931 A1 | 5/2018 | Bower et al. | |
| 2019/0229097 A1 | 7/2019 | Takeya et al. | |
| 2019/0371987 A1 | 12/2019 | Perkins et al. | |
| 2020/0067009 A1* | 2/2020 | Wu | H10K 50/868 |
| 2021/0005583 A1* | 1/2021 | Iguchi | H10K 50/115 |

FOREIGN PATENT DOCUMENTS

| | | | |
|---|---|---|---|
| CN | 111615749 A | 9/2020 | |
| WO | 2019/147589 A1 | 8/2019 | |
| WO | WO-2021027405 A1 * | 2/2021 | ......... H01L 25/0753 |

* cited by examiner

*Primary Examiner* — Antonio B Crite
(74) *Attorney, Agent, or Firm* — CKC & Partners Co., LLC

(57) ABSTRACT

A micro LED structure includes a first micro LED chip having opposite first and second sides, a second micro LED chip adjacent to the first side of the second micro LED chip, a third micro LED chip adjacent to the first side of the first micro LED chip, and optical structures respectively over the first micro LED chip, the second micro LED chip and the third micro LED chip. Each of the first, second and third micro LED chip includes a semiconductor stack, a metal pad and a reflective coating layer. The semiconductor stack includes a first semiconductor layer, an active layer in contact with the first semiconductor layer, and a second semiconductor layer in contact with the active layer. The metal pad is in contact with the first semiconductor layer, and the reflective coating layer is disposed around sidewalls of the semiconductor stack.

19 Claims, 23 Drawing Sheets

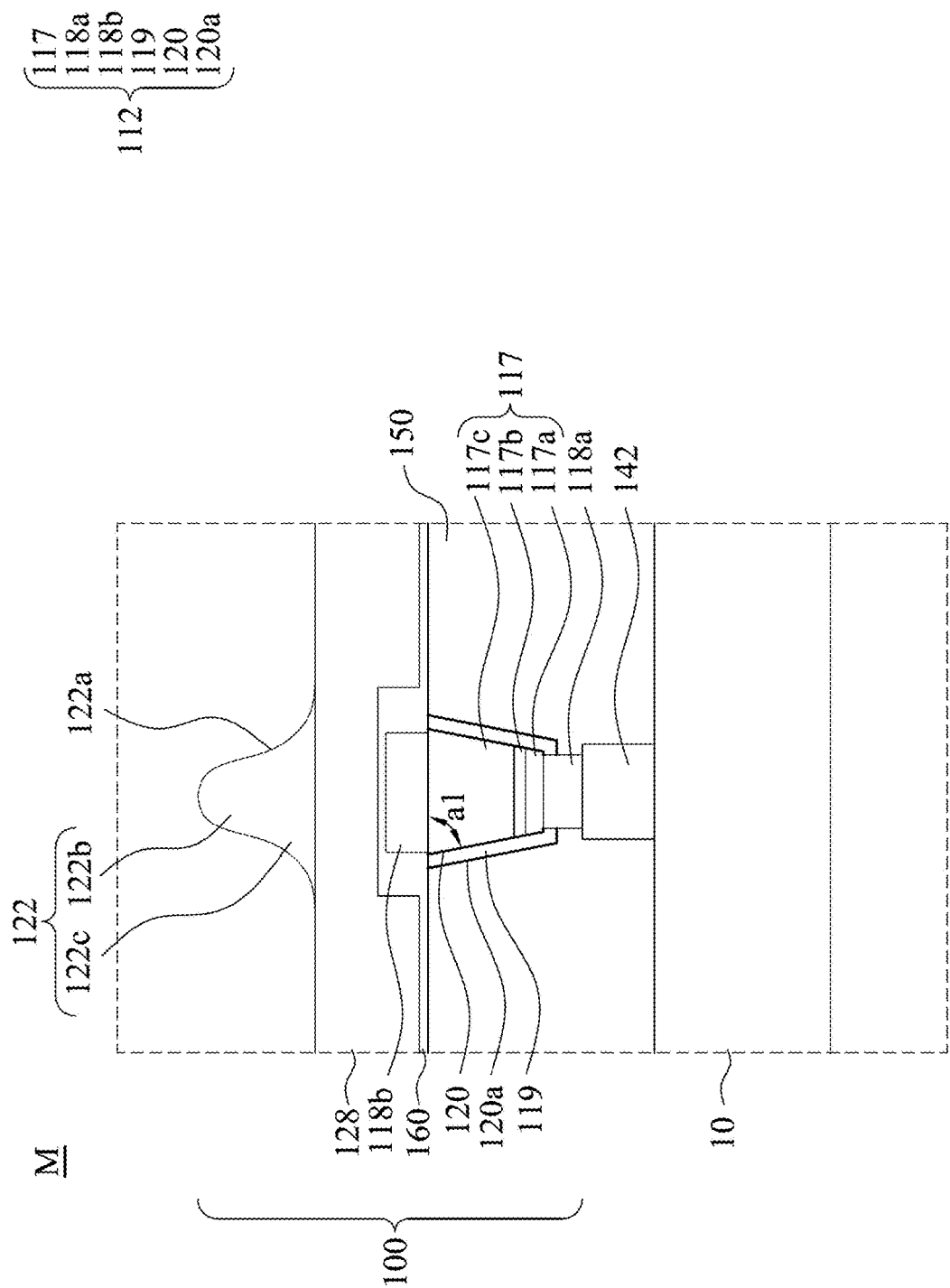

| Structure | Structure 1 | Structure 2 | Structure 3 | Structure 4 | Structure 5 | Structure 6 |
|---|---|---|---|---|---|---|
| Angle | ±74° | ±60° | ±63° | ±38° | ±44° | ±35° |
| Average of 25th percentile near the center | 0.0357 | 0.0469 | 0.0652 | 0.0767 | 0.0894 | 0.076 |
| Gain value | 1 | 1.313 | 1.826 | 2.148 | 2.504 | 2.218 |

Fig. 11

MICRO LED STRUCTURE AND DISPLAY DEVICE

BACKGROUND

Field of Invention

The present disclosure relates to a micro LED structure and a display device, and more particularly, the micro LED structure and the display device with optical structures.

Description of Related Art

In recent years, augmented reality (AR) technology and virtual reality (VR) technology have been developed rapidly and their applications have become quite popular. However, light patterns of conventional micro light-emitting diodes (LED) are not suitable for AR/VR application generally. Therefore, novel micro LEDs with improved light patterns are desired for AR/VR applications.

SUMMARY

In accordance with some embodiments of the present disclosure, a micro LED structure includes a first micro LED chip having opposite first and second sides, a second micro LED chip adjacent to the first side of the first micro LED chip, a third micro LED chip adjacent to the first side of the first micro LED chip, and optical structures respectively over the first micro LED chip, the second micro LED chip and the third micro LED chip. Each of the first micro LED chip, the second micro LED chip and the third micro LED chip comprises a semiconductor stack, a metal pad and a reflective coating layer. The semiconductor stack includes a first semiconductor layer, an active layer in contact with the first semiconductor layer, and a second semiconductor layer in contact with the active layer. The metal pad is in contact with the first semiconductor layer, and the reflective coating layer is disposed around sidewalls of the semiconductor stack.

In accordance with some embodiments of the present disclosure, the micro LED structure further includes a planarization layer surrounding the first micro LED, the second micro LED and the third micro LED.

In accordance with some embodiments of the present disclosure, the optical structures includes a first lens over the first micro LED chip, a second lens over the second micro LED chip, and a third lens over the third micro LED chip.

In accordance with some embodiments of the present disclosure, the first lens is circular asymmetric about a center of the first lens, the second lens is circular symmetric about a center of the second lens, and the third lens is circular symmetric about a center of the third lens.

In accordance with some embodiments of the present disclosure, from a cross-section view, each of the first lens, the second lens and the third lens has a top portion and a bottom portion, and the top portion has a convex sidewall and the bottom portion has a concave sidewall.

In accordance with some embodiments of the present disclosure, the micro LED structure further includes a transmission layer between the first lens and the first micro LED chip.

In accordance with some embodiments of the present disclosure, the transmission layer is transparent.

In accordance with some embodiments of the present disclosure, a material of the transmission layer is the same as a material of the first lens.

In accordance with some embodiments of the present disclosure, a first common external tangent of the first lens and the second lens is substantially perpendicular to a lengthwise direction of the first lens, and a second common external tangent of the first lens and the third lens is substantially perpendicular to the lengthwise direction of the first lens.

In accordance with some embodiments of the present disclosure, the optical structures include a first reflective cup over the first micro LED chip, a second reflective cup over the second micro LED chip, and a third reflective cup over the third micro LED chip.

In accordance with some embodiments of the present disclosure, the first reflective cup is rectangular from a top view, and the second reflective cup and the third reflective cup are square from the top view.

In accordance with some embodiments of the present disclosure, each of the first reflective cup, second reflective cup and the third reflective cup has curved inner sidewalls.

In accordance with some embodiments of the present disclosure, the curved inner sidewalls are concave.

In accordance with some embodiments of the present disclosure, the curved inner sidewall of first reflective cup has a top portion and a bottom portion, and the bottom portion of the curved inner sidewall is more slanted than that of the top portion of the curved inner sidewall.

In accordance with some embodiments of the present disclosure, an area of a bottom opening of the first reflective cup is about a sum of an area of a bottom opening of the second reflective cup and an area of a bottom opening of the third reflective cup.

In accordance with some embodiments of the present disclosure, the optical structures further includes a first lens disposed in the first reflective cup, a second lens disposed in the second reflective cup, and a third lens disposed in the third reflective cup.

In accordance with some embodiments of the present disclosure, the first lens is circular asymmetric about a center of the first reflective cup, the second lens is circular symmetric about a center of the second reflective cup, and the third lens is circular symmetric about a center of the third reflective cup.

In accordance with some embodiments of the present disclosure, an air gap is between the first reflective cup and the first lens.

In accordance with some embodiments of the present disclosure, a ratio of a height of the first lens to a height of the first reflective cup is greater than about 0.5 and less than about 1.

In accordance with some embodiments of the present disclosure, the first lens includes a top portion and a bottom portion between the top portion and the first micro LED chip. The first reflective cup includes a top portion surrounding the top portion of the first lens and a bottom portion surrounding the bottom portion of the first lens, and a sidewall of the top portion of the first reflective cup has a slope different from a slope of a sidewall of the bottom portion of the first reflective cup.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 3C is an enlarged view of region M in FIG. 3B in accordance with some embodiments of the present disclosure.

FIG. 11 illustrates data related of performances of different micro LED structures in accordance with some embodiments of the present disclosure.

DETAILED DESCRIPTION

Figure 1:
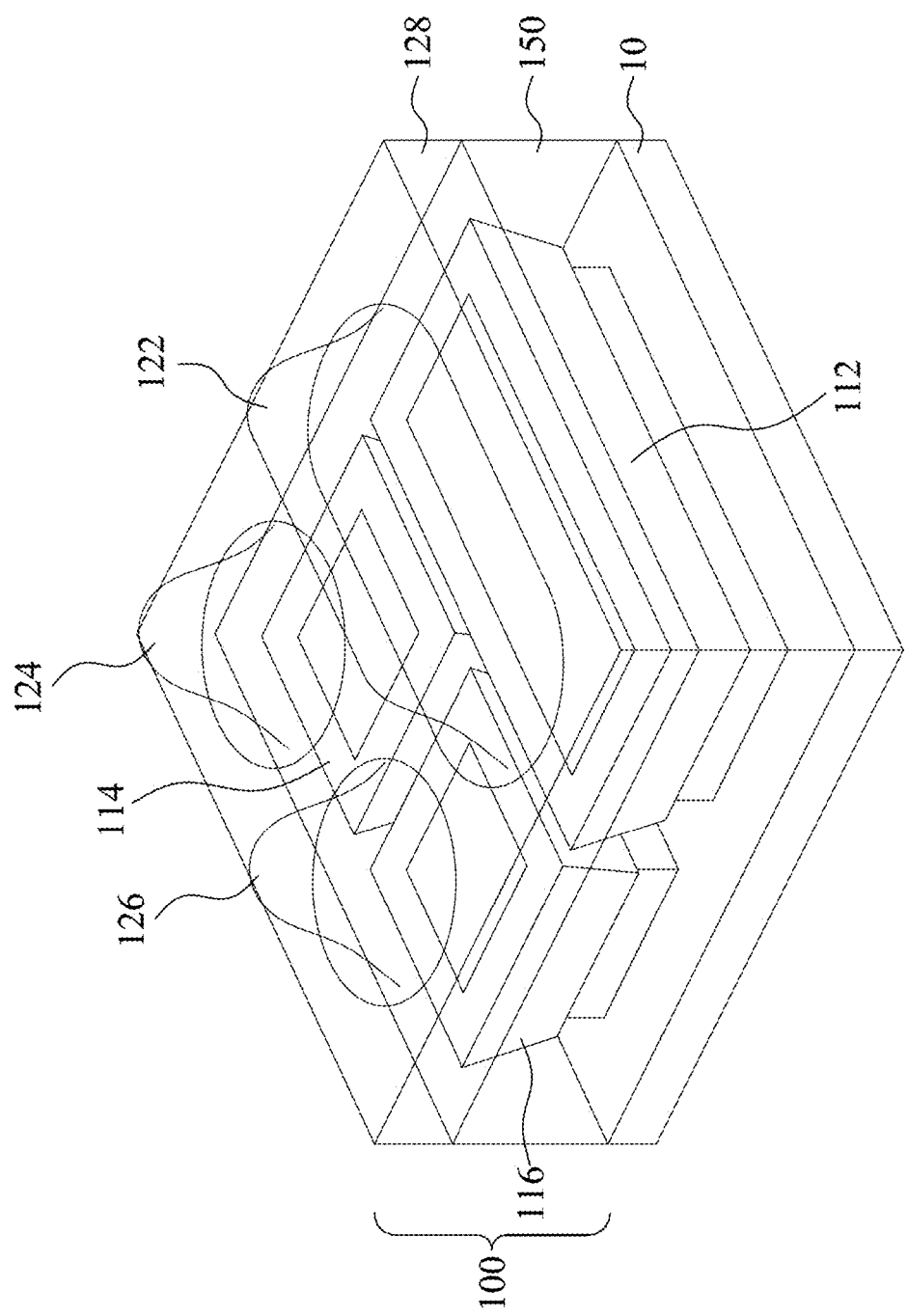
FIG. 1 is a perspective view of a micro LED structure on a substrate in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Some embodiments of the present disclosure provide light-emitting diode (LED) structures that include optical structures over micro LED chips to improve or modify light patterns of the micro LED chips. Discussed in greater detail, some embodiments of the present disclosure can reduce beam angles to concentrate the light efficiently to reach a high light intensity at a small beam angle. Some embodiments in the present disclosure are used in AR/VR devices to produce directional light sources. Therefore, the impact caused by image crosstalk will be diminished.

FIG. 1 is a perspective view of a micro LED structure 100 on a substrate 10 in accordance with some embodiments of the present disclosure. The micro LED structure 100 may include a first micro LED chip 112, a second micro LED chip 114 and a third micro LED chip 116, a first lens 122, a second lens 124, a third lens 126, a transmission layer 128 and a planarization layer 150. Detailed discussion of the micro LED structure 100 will be discussed in the following.

Figure 2:
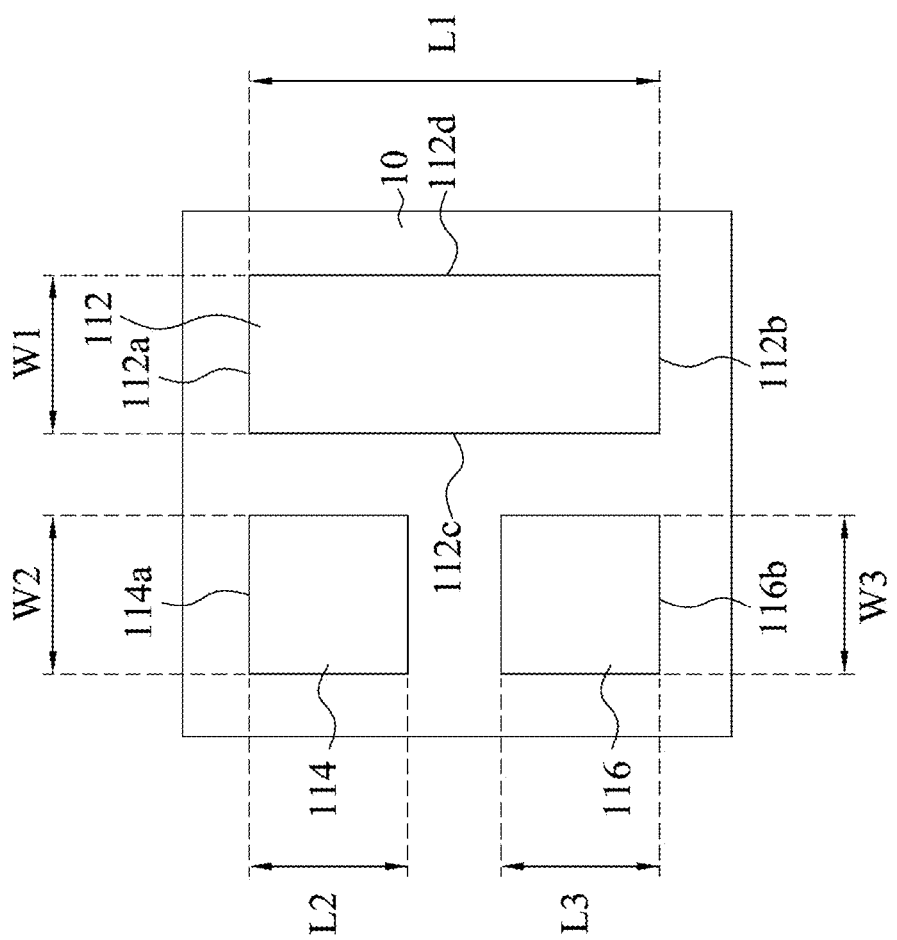
FIG. 2 is a top view of multiple micro LED chips of the micro LED structure of FIG. 1 in accordance with some embodiments of the present disclosure.
Figure 3A:
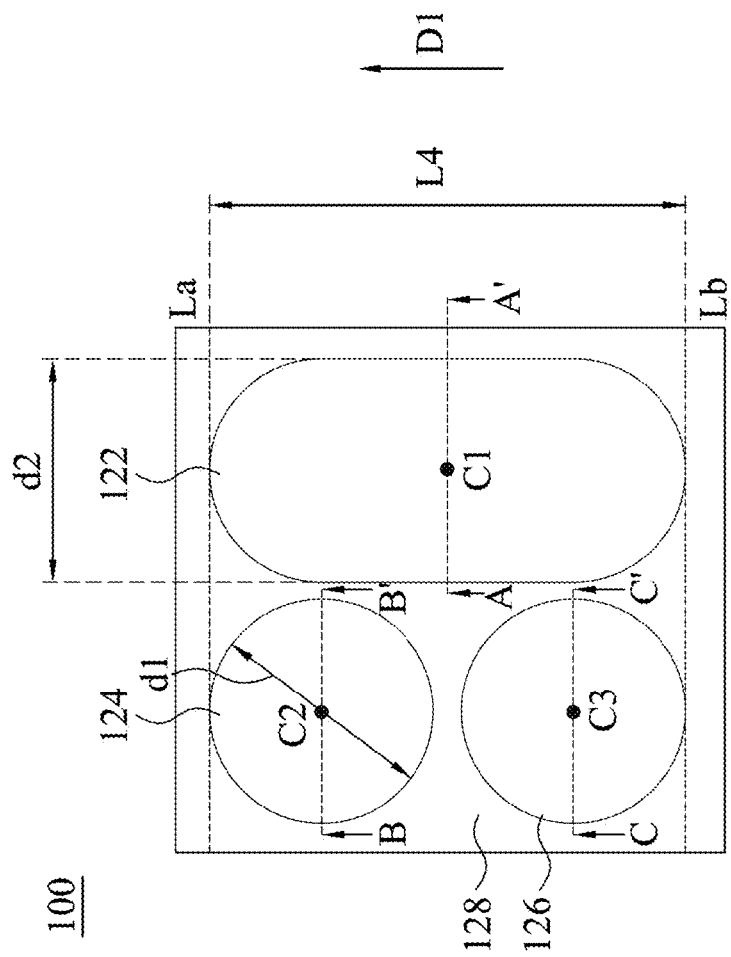
FIG. 3A is a top view of the micro LED structure of FIG. 1 in accordance with some embodiments of the present disclosure.

FIG. 2 is a top view of multiple micro LED chips of the micro LED structure 100 in accordance with some embodiments of the present disclosure, and FIG. 3A is a top view of the micro LED structure 100 of FIG. 1 in accordance with some embodiments of the present disclosure. In FIG. 2, the micro LED structure 100 includes the first micro LED chip 112, the second micro LED chip 114 and the third micro LED chip 116. The first micro LED chip 112, the second micro LED chip 114 and the third micro LED chip 116 may be chips used for emitting different colors. For example, the first micro LED chip 112 may be a red micro LED chip, the second micro LED chip 114 may be a blue micro LED chip, and the third micro LED chip 116 may be a green micro LED chip.

In some embodiments, the first micro LED chip 112 has a length L1 in a range from about 14 μm to about 16 μm and a width W1 in a range from about 5.5 μm to about 6.5 μm. In some embodiments, the second micro LED chip 114 has a length L2 and a width W2 each in a range from about 5.5 μm to about 6.5 prn. In some embodiments, the third micro LED chip 116 has a length L3 and a width W3 each in a range from about 5.5 μm to about 6.5 μm. In some embodiments, a base area (i.e., W1×L1) of the first micro LED chip 112 is larger than a base area (i.e., W2×L2) of the second micro LED chip 114. In some embodiments, the base area (i.e., W1×L1) of the first micro LED chip 112 is larger than a base area (i.e., W3×L3) of the third micro LED chip 116.

In some embodiments, the base area of the second micro LED chip 114 is substantially the same as the base area of the third micro LED chip 116. In some embodiments, a ratio of the base area of the first micro LED chip 112 to the base area of the second micro LED chip 114 (or the base area of the third micro LED chip 116) is in a range from about 2 to about 2.5. With such ratio range, the color performance of the micro LED structure 100 can be improved.

In some embodiments, the first micro LED chip 112, the second micro LED chip 114 and the third micro LED chip 116 are rectangular in the top view. For example, the first micro LED chip 112 is rectangular, and the second micro LED chip 114 and the third micro LED chip 116 are substantially square, as shown in the top view of FIG. 2. The term "substantially" herein means that all sides of the second micro LED chip 114 (or the third micro LED chip 116) have substantially same lengths, or a length difference between the longest side (having the length L2 (L3)) and the shortest side (having the width W2 (W3)) is less than 5%.

In some embodiments, the first micro LED chip 112, the second micro LED chip 114 and the third micro LED chip 116 are arranged as shown in FIG. 2. The first micro LED chip 112 has opposite sides 112a, 112b and opposite sides 112c, 112d. The second micro LED chip 114 and the third micro LED chip 116 are adjacent to the side 112c of the first micro LED chip 112 and adjacent to each other. Moreover, the side 112a of the first micro LED chip 112 is substantially aligned to a side 114a of the second micro LED chip 114, and the side 112b of the first micro LED chip 112 is substantially aligned to a side 116b of the third micro LED chip 116.

It is noted that the color, the shape, the size and the arrangement of the micro LED chips are not limited as discussed before. For example, the size and the shape of the first micro LED chip 112, the second micro LED chip 114 and the third micro LED chip 116 may be adjusted, so that the ratio of the base area of the first micro LED chip 112 to the base area of the second micro LED chip 114 (or the third micro LED chip 116) may be smaller. Basically, the sizes of the first micro LED chip 112, the second micro LED chip 114 and the third micro LED chip 116 depend on the lighting efficiency thereof. Therefore, the micro LED chip with poor lighting efficiency has a larger base area, while the micro LED chip with good lighting efficiency has a smaller base area. The side 112a of the first micro LED chip 112 may be misaligned with the side 114a of the second micro LED chip 114, and/or the side 112b of the first micro LED chip 112 may be misaligned with the side 116b of the third micro LED chip 116 accordingly.

Figure 3B:
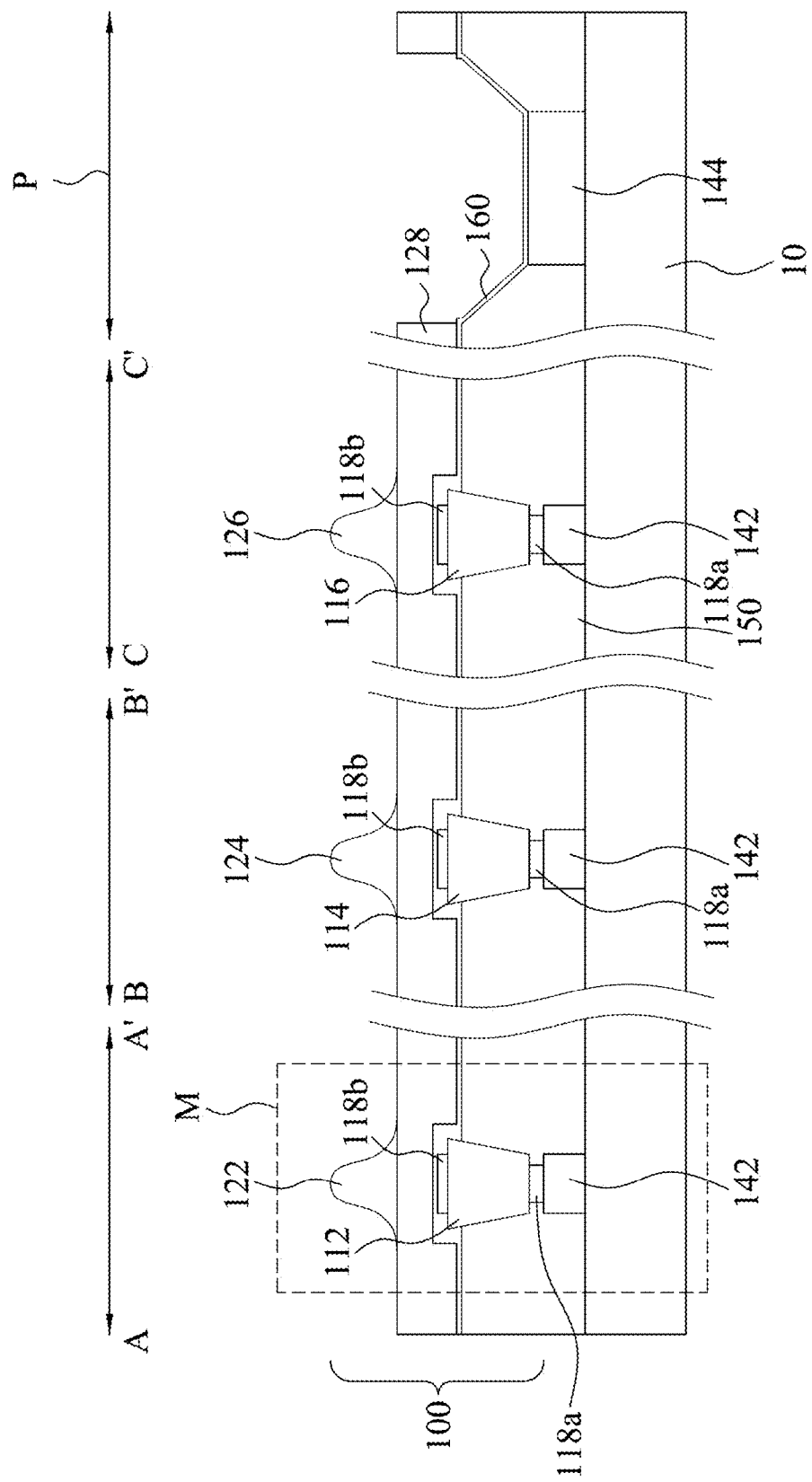
FIG. 3B is a cross-section view taken along line A-A', line B-B' and line C-C' in FIG. 3A, a peripheral structure of the micro LED structure and the substrate in accordance with some embodiments of the present disclosure.

FIG. 3B is a cross-section view taken along line A-A', line B-B' and line C-C' in FIG. 3A, a peripheral structure P of the micro LED structure 100, and the substrate 10 in accordance with some embodiments of the present disclosure. In FIGS. 3A and 3B, the micro LED structure 100 further includes optical structures, such as the first lens 122, the second lens 124 and the third lens 126, disposed over the first micro LED chip 112, the second micro LED chip 114 and the third micro LED chip 116, respectively. The optical structures, such as the first lens 122, the second lens 124 and the third lens 126, are used to improve light pattern, including reducing beam angle and enhancing intensity, of the light emitted from the first micro LED chip 112, the second micro LED chip 114 and the third micro LED chip 116. Detailed discussion of the micro LED structure 100 will be discussed in reference to FIGS. 3B-3C.

In FIG. 3B, the micro LED structure 100 is over the substrate 10. The substrate 10 may be made of any suitable materials, such as a semiconductor material (e.g. silicon) or other suitable materials. A first contact pad 142 may be placed between the substrate 10 and each of the first micro LED chip 112, the second micro LED chip 114 and the third micro LED chip 116 to provide electrical connection. In some embodiments, the micro LED structure 100 further includes the planarization layer 150 and a transparent conductive layer 160. The planarization layer 150 surrounds the first micro LED chip 112, the second micro LED chip 114 and the third micro LED chip 116. Stated another way, the first micro LED chip 112, the second micro LED chip 114 and the third micro LED chip 116 are embedded in the planarization layer 150. The planarization layer 150 may be made of any suitable transparent encapsulation materials to provide electrical isolation between the micro LED chips. The transparent conductive layer 160 may be disposed over the planarization layer 150 and the first micro LED chip 112, the second micro LED chip 114 and the third micro LED chip 116. In some embodiments, the transparent conductive layer 160 is made of indium tin oxide (ITO) or other suitable materials.

The first lens 122, the second lens 124 and the third lens 126 are respectively over the first micro LED chip 112, the second micro LED chip 114 and the third micro LED chip 116. The manufacturing method of the first lens 122, the second lens 124 and the third lens 126 is discussed in the following. An optical structure layer made of suitable materials, such as macromolecule materials, photoresists and glue materials, for forming the first lens 122, the second lens 124 and the third lens 126 may be first disposed over the transparent conductive layer 160. The optical structure layer is then patterned by nano-imprint lithography (NIL), etching or any other suitable process. Finally, the patterned optical structure layer undergoes thermal curing or ultra violet (UV) curing to form the first lens 122, the second lens 124 and the third lens 126. The material (i.e. the optical structure layer) of the first lens 122, the second lens 124 and the third lens 126 is transparent. Thereby, the light emitted from the first micro LED chip 112, the second micro LED chip 114 and the third micro LED chip 116 are able to penetrate through the first lens 122, the second lens 124 and the third lens 126 respectively, further reducing beam angle and enhancing intensity.

In some embodiments, the micro LED structure 100 further includes a transmission layer 128 over the transparent conductive layer 160. Accordingly, the transmission layer 128 is between the lenses (such as the first lens 122, the second lens 124 and the third lens 126) and the micro LED chips (such as the first micro LED chip 112, the second micro LED chip 114 and the third micro LED chip 116) and extends over the transparent conductive layer 160. In some embodiments, the transmission layer 128 is made of the same material as the first lens 122, the second lens 124 and the third lens 126. Thus, the transmission layer 128 is also transparent. The transmission layer 128 provides a distance for light to transmit and has a width greater than 0 μm and equal to or less than 10 μm.

FIG. 3C is an enlarged view of region M in FIG. 3B in accordance with some embodiments of the present disclosure. In the region M, a detailed configuration of the first micro LED chip 112 and the first lens 122 is shown. It is noted that the structure shown in FIG. 3C can also applied to the configuration of the second micro LED chip 114 and the second lens 124 and/or the configuration of the third micro LED chip 116 and the third lens 126. The first micro LED chip 112 includes a semiconductor stack 117, a first metal pad 118a and a passivation layer 119. The semiconductor stack 117 includes a first semiconductor layer 117a, an active layer 117b in contact with the first semiconductor layer 117a, and a second semiconductor layer 117c in contact with the active layer 117b. The first semiconductor layer 117a and the second semiconductor layer 117c may be made of the same semiconductor material, and the first semiconductor layer 117a has a conductivity type different from the type of the second semiconductor layer 117c. For example, both the first semiconductor layer 117a and the second semiconductor layer 117c are made of GaN. The first semiconductor layer 117a is p-type, while the second semiconductor layer 117c is n-type. In some other embodiments, the first semiconductor layer 117a and the second semiconductor layer 117c may be made of different semiconductor materials. In some embodiments, the sidewalls of the semiconductor stack 117 are tapered, and an angle a1 is formed between the sidewalls of the semiconductor stack 117 and the top surface of the second semiconductor layer 117c. In some embodiments, the angle a1 is in a range from about 70° to about 80°. With such angle range, light emitted from the active layer 117b can be guided upwards.

The first metal pad 118a is in contact with the first semiconductor layer 117a. The first metal pad 118a provides electrical connection between the first semiconductor layer 117a of the first micro LED chip 112 and the first contact pad 142. The first metal pad 118a may be made of any suitable conductive materials such as metals. In some embodiments, the first metal pad 118a is made of Cr, Pt, Au, combinations thereof or the like. Optionally, a second metal pad 118b is formed on the second semiconductor layer 117c and is made of suitable conductive materials such as metals, e.g., Cr, Pt, Au, combinations thereof or the like. The second metal pad 118b may provide electrical connection between the second semiconductor layer 117c and a second contact 144 in the peripheral structure P (see FIG. 3B) through the transparent conductive layer 160.

The passivation layer 119 wraps around sidewalls of the semiconductor stack 117. The passivation layer 119 may be made of any suitable dielectric materials, such as $SiO_2$, SiN, SiON or other suitable oxides and nitrides, to protect the semiconductor stack 117. The first micro LED chip 112 further includes a reflective coating layer 120 around the sidewalls of the semiconductor stack 117 and covered by the passivation layer 119. Alternatively or in addition, a reflective coating layer 120a wrapping around the passivation layer 119 is formed. In some embodiments, the reflective coating layers 120 and 120a may be distributed Bragg reflectors (DBR), highly reflective macromolecular materials, metal, or combinations thereof. The reflective coating layers 120 and 120a reflect the light emitted from the active layer 117b towards the first lens 122, thereby improving the performance of the subsequently formed device. It is noted that the detailed structures of the second micro LED chip 114 and the third micro LED chip 116 are similar to or same as the detailed structure of the first micro LED chip 112.

Further, the first lens 122 is over the first micro LED chip 112. The boundary 122a of the first lens 122 from the cross-section view may be non-spherical, spherical, or free-form shapes. For example, a top portion 122b of the first lens 122 has a convex sidewall, and a bottom portion 122c of the first lens 122 has a concave sidewall. In some embodiments, the first lens 122 has a height in a range of about 1 μm to about 10 μm. In some embodiments, the top portion 122b has a height in a range of about 0.3 to about 0.7 of the height of the first lens 122, and the bottom portion 122c has a height in a range of about 0.3 to about 0.7 of the height of the first lens 122.

Turning back to FIG. 3A, the top view of the first lens 122, the second lens 124 and the third lens 126 are illustrated. The first lens 122, the second lens 124 and the third lens 126 are neatly arranged in FIG. 3A. For example, a first common external tangent line La of the first lens 122 and the second lens 124 is substantially perpendicular to a lengthwise direction D1 of the first lens 122, and a second common external tangent line Lb of the first lens 122 and the third lens 126 is substantially perpendicular to the lengthwise direction D1 of the first lens 122. The term "substantially" herein means that the angle between the first common external tangent line La (or the second common external tangent line Lb) and the lengthwise direction D1 of the first lens 122 is in range of about 87° to about 93°. In addition, from the top view, the first lens 122 is circular asymmetric about a center C1 of the first lens 122, the second lens 124 is circular symmetric about a center C2 of the second lens 124, and the third lens 126 is circular symmetric about a center C3 of the third lens 126. For example, the first lens 122 can't map onto itself unless the first lens 122 is rotated about the center C1 by 180 degrees or 360 degrees, the second lens 124 maps onto itself when the second lens 124 is rotated about the center C2 by any angles, and the third lens 126 maps onto itself when the third lens 126 is rotated about the center C3 by any angles. With such configuration, the light emitted from the first micro LED chip 112, the second micro LED chip 114 and the third micro LED chip 116 are evenly modified to improve the light pattern, such as reduce beam angle and enhance light intensity. In some embodiments, the second lens 124 and the third lens 126 have a diameter d1 in range from about 8 μm to about 9 μm respectively. In addition, the first lens 122 is a rectangle with two semicircles at two ends respectively. The first lens 122 has an overall length L4 in range from about 16 μm to about 18 μm and the semicircles have a diameter d2 in range from about 8 μm to about 9 μm respectively.

Figure 4:
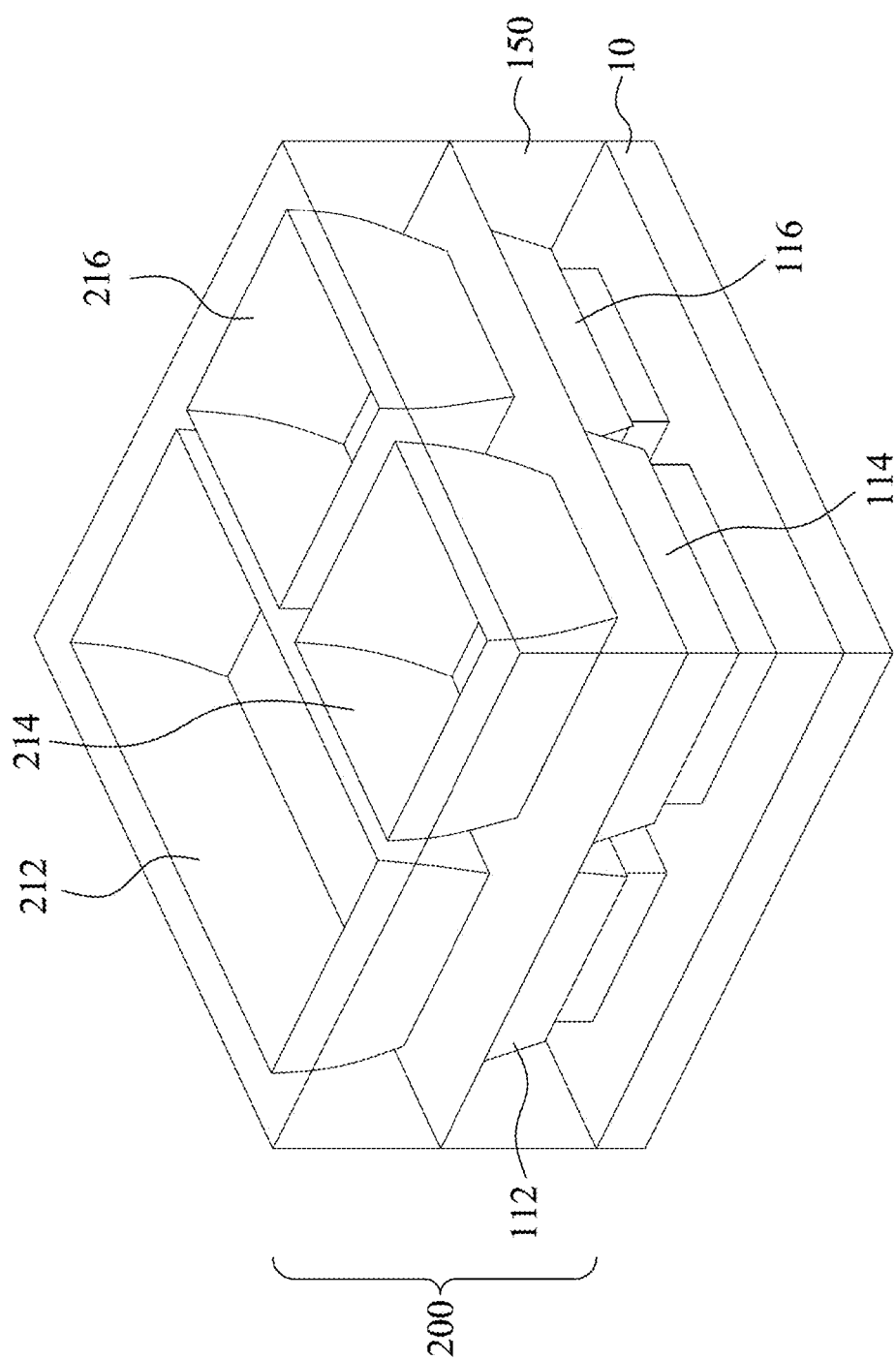
FIG. 4 is a perspective view of a micro LED structure on a substrate in accordance with some embodiments of the present disclosure.
Figure 5A:
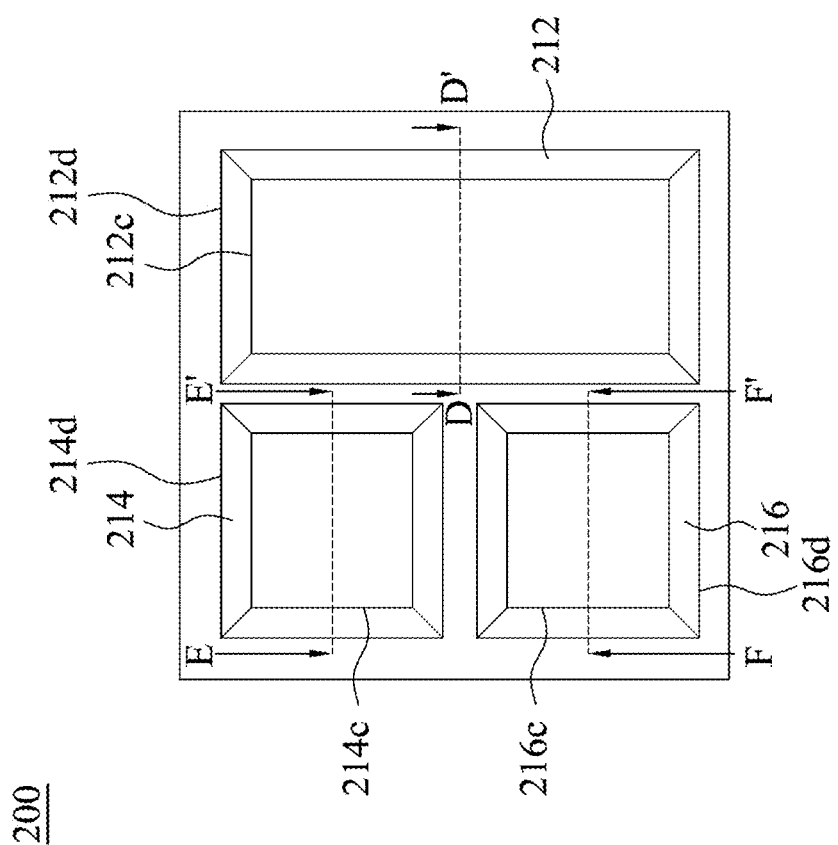
FIG. 5A is a top view of the micro LED structure in FIG. 4 in accordance with some embodiments of the present disclosure.

FIG. 4 is a perspective view of a micro LED structure 200 on a substrate 10 in accordance with some embodiments of the present disclosure. FIG. 5A is a top view of the micro LED structure 200 in FIG. 4 in accordance with some embodiments of the present disclosure. The difference between the micro LED structure 200 of FIG. 4 and FIG. 5A and the micro LED structure 100 of FIG. 1 pertains to the configurations of the optical structures. That is, the micro LED structure 200 includes the micro LED chips (i.e., the first micro LED chip 112, the second micro LED chip 114 and the third micro LED chip 116) arranged as shown in FIG. 2. In the micro LED structure 200, the first lens 122, the second lens 124 and the third lens 126 (see FIG. 1) are replaced with other optical structures, such as a first reflective cup 212, a second reflective cup 214 and a third reflective cup 216. The first reflective cup 212, the second reflective cup 214 and the third reflective cup 216 are also used to improve light pattern, including reducing beam angle and enhancing intensity, of the light emitted from the first micro LED chip 112, the second micro LED chip 114 and the third micro LED chip 116. In some embodiments where the first micro LED chip 112 is substantially rectangular and the second micro LED chip 114 and the third micro LED chip 116 are substantially square, the first reflective cup 212 is formed as a rectangle, and the second reflective cup 214 and the third reflective cup 216 are formed as substantially squares from the top view. In other words, the first reflective cup 212, the second reflective cup 214 and the third reflective cup 216 are substantially formed over and along the sidewalls of the first micro LED chip 112, the second micro LED chip 114 and the third micro LED chip 116 respectively. Light emitted from the first micro LED chip 112, the second micro LED chip 114 and the third micro LED chip 116 are modified by the first reflective cup 212, the second reflective cup 214 and the third reflective cup 216 respectively, thereby reducing the manufacturing cost. Further, the size of the first reflective cup 212, the second reflective cup 214 and the third reflective cup 216 may be adjusted based on different situations. In some embodiments where the first micro LED chip 112 has larger base area than that of the second micro LED chip 114 and the third micro LED chip 116, an area of the bottom opening 212c of the first reflective cup 212 is about the sum of the bottom opening 214c of the second reflective cup 214 and the bottom opening 216c of the third reflective cup 216 to make the sizes of the first reflective cup 212, the second reflective cup 214 and the third reflective cup 216 fit the sizes of the first micro LED chip 112, the second micro LED chip 114 and the third micro LED chip 116. In some embodiments, each of the bottom opening 214c and the bottom opening 216c has side lengths in a range from about 5.5 μm to about 6.5 The bottom opening 212c has a length in a range from about 14 μm to about 16 μm and a width in a range from about 5.5 μm to about 6.5 μm. In addition, a top opening 212d of the first reflective cup 212 has a length in a range from about 17 μm to about 19 μm and a width in a range from about 8.5 to about 9.5 μm, and top openings 214d, 216d of the second reflective cup 214 and the third reflective cup 216 has side lengths in a range from about 7.5 to about 8.5 μm.

Figure 5B:
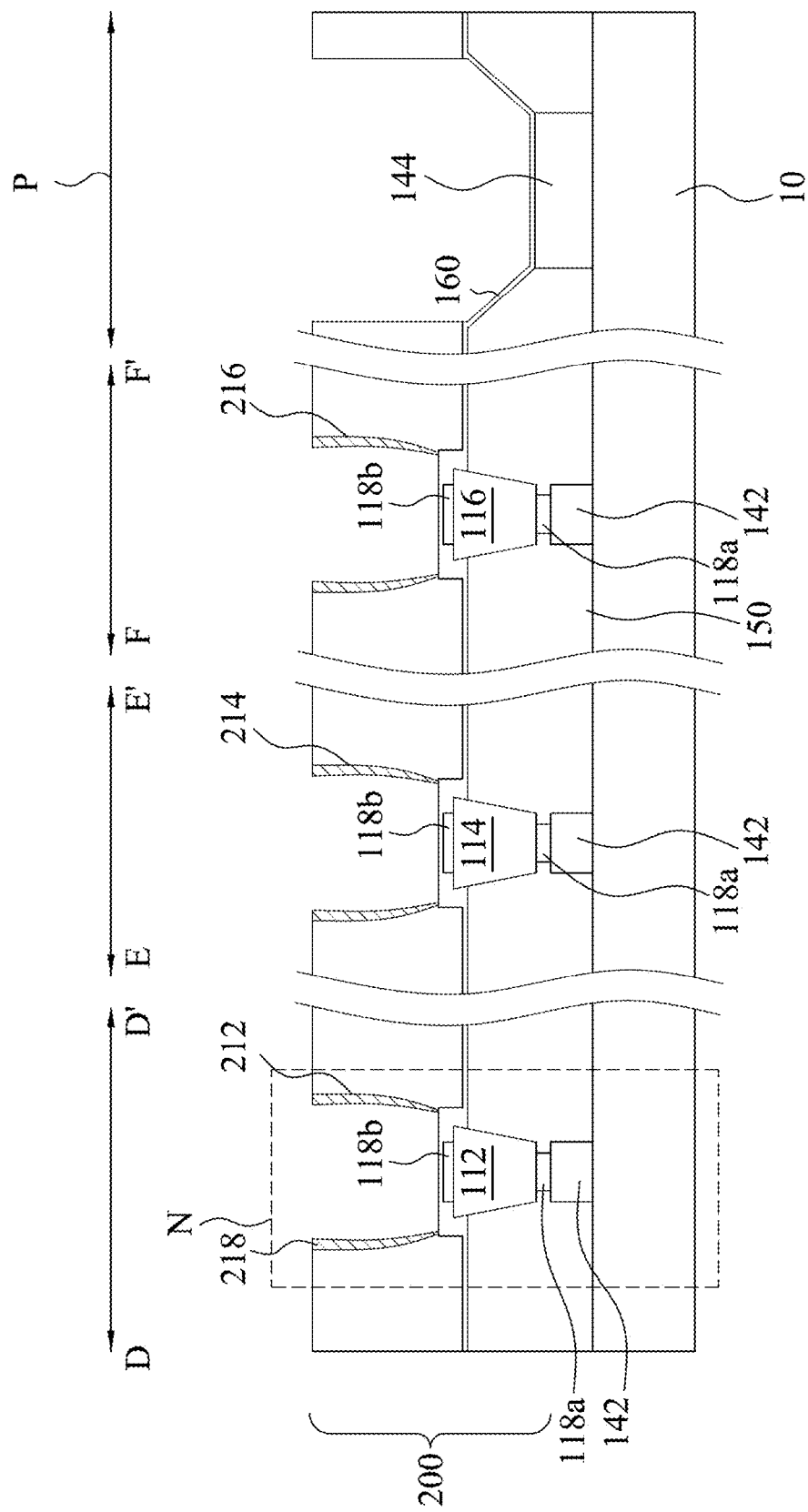
FIG. 5B is a cross-section view taken along line D-D', line E-E' and line F-F' in FIG. 5A, a peripheral structure of the micro LED structure and the substrate in accordance with some embodiments of the present disclosure.

FIG. 5B is a cross-section view taken along line D-D', line E-E' and line F-F' in FIG. 5A, a peripheral structure P of the micro LED structure 200, and the substrate 10 in accordance with some embodiments of the present disclosure. The first reflective cup 212, the second reflective cup 214 and the third reflective cup 216 are formed over the first micro LED chip 112, the second micro LED chip 114 and the third micro LED chip 116 respectively. In some embodiments, cups are formed over the substrate 10 and are coated with reflective coating layers 218 to form the first reflective cup 212, the second reflective cup 214 and the third reflective cup 216. The material of the reflective coating layers 218 is similar to or the same as the reflective coating layers 120 or 120a. Other details of the micro LED structure 200 are similar to or same as the details related to the micro LED structure 100 shown in FIG. 3B; therefore, repeated description is not discussed herein.

Figure 5C:
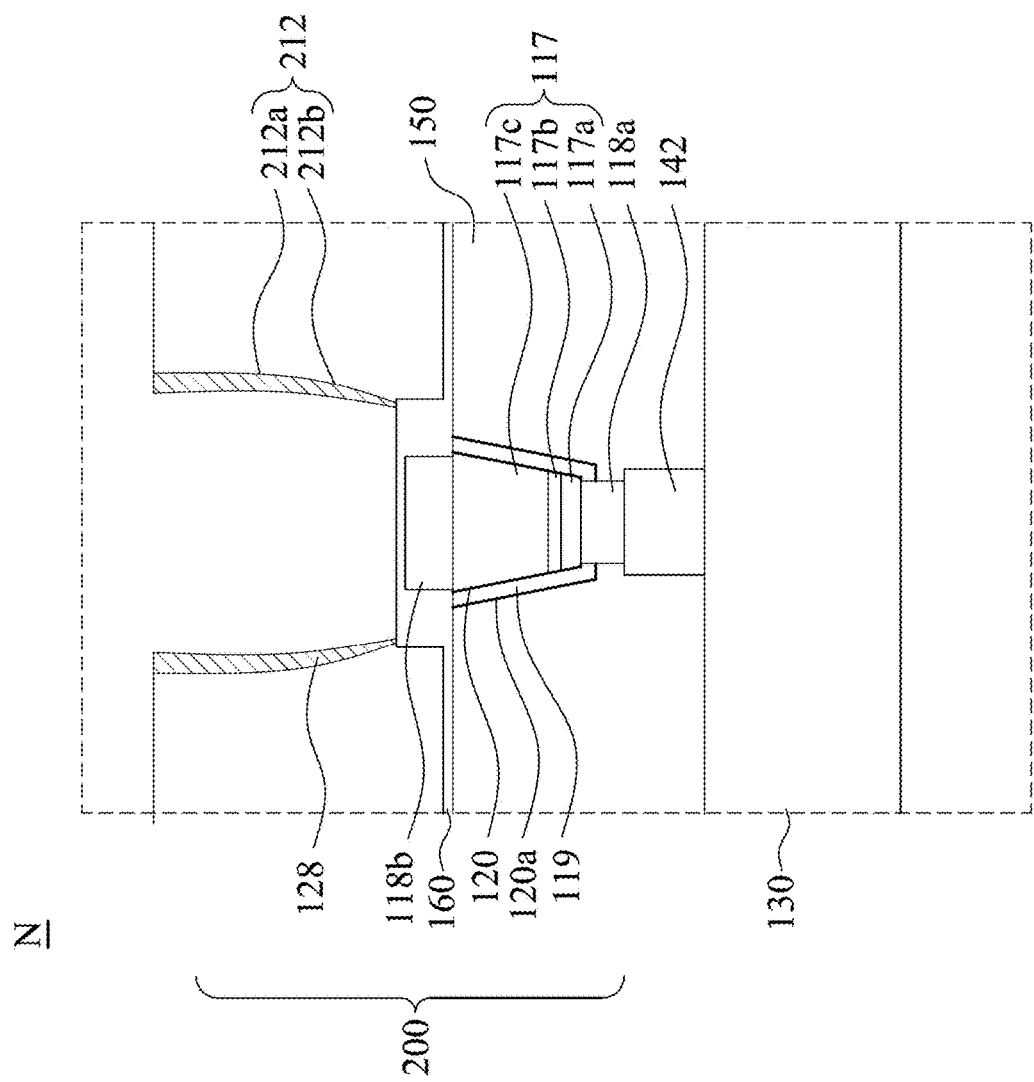
FIG. 5C is an enlarged view of region N in FIG. 5B in accordance with some embodiments of the present disclosure.

FIG. 5C is an enlarged view of region N in FIG. 5B in accordance with some embodiments of the present disclosure. In the region N, a detailed configuration of the first micro LED chip 112 and the first reflective cup 212 is shown. The detailed discussion related to the first micro LED chip 112 has been discussed in FIG. 3C; therefore, repeated description is not discussed herein. It is noted that the structure shown in FIG. 5C can also applied to the configuration of the second micro LED chip 114 and the second reflective cup 214 and/or the configuration of the third micro LED chip 116 and the third reflective cup 216. The first reflective cup 212 (or the second reflective cup 214, the third reflective cup 216) may be formed in non-spherical, spherical, or arbitrary curvilinear shapes. For example, the first reflective cup 212 (or the second reflective cup 214, the third reflective cup 216) may has a curved inner sidewall, such as the concave sidewall shown in FIG. 5C. In some embodiments, the first reflective cup 212 has a top portion 212a and a bottom portion 212b. The bottom portion 212b of the curved inner sidewall is more slanted than that of the top portion 212a of the curved inner sidewall. In other words, a slope of the bottom portion 212b is different from and less than a slope of the top portion 212a. Stated another way, the slope of the sidewall of the first reflective cup 212 (or the second reflective cup 214, the third reflective cup 216) decreases downward. With such configuration, the first reflective cup 212 can concentrate the light emitted from the first micro LED chip 112 well, thereby reducing beam angle and enhancing light intensity.

Figure 6:
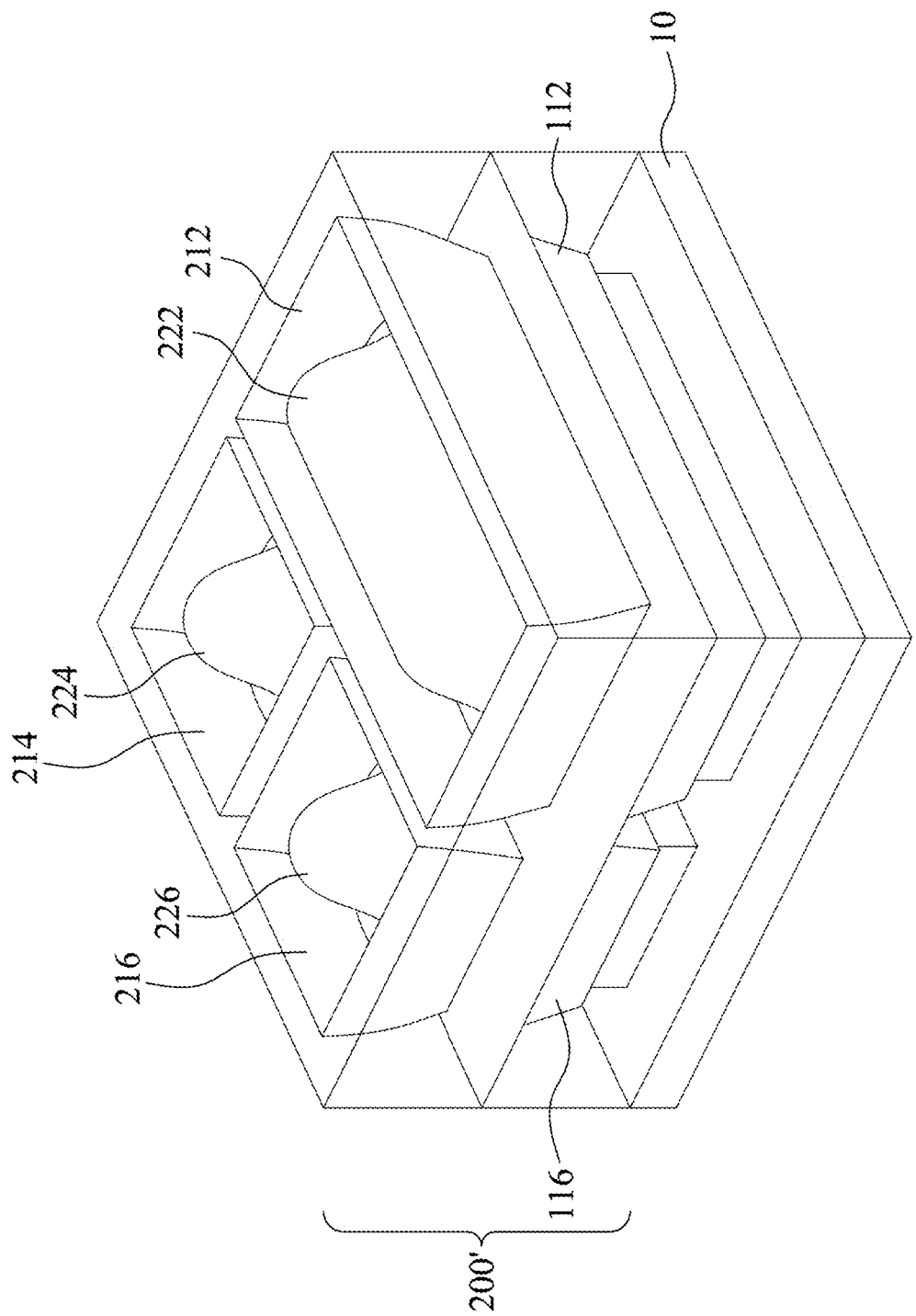
FIG. 6 is a perspective view of a micro LED structure on a substrate in accordance with some embodiments of the present disclosure.
Figure 7:
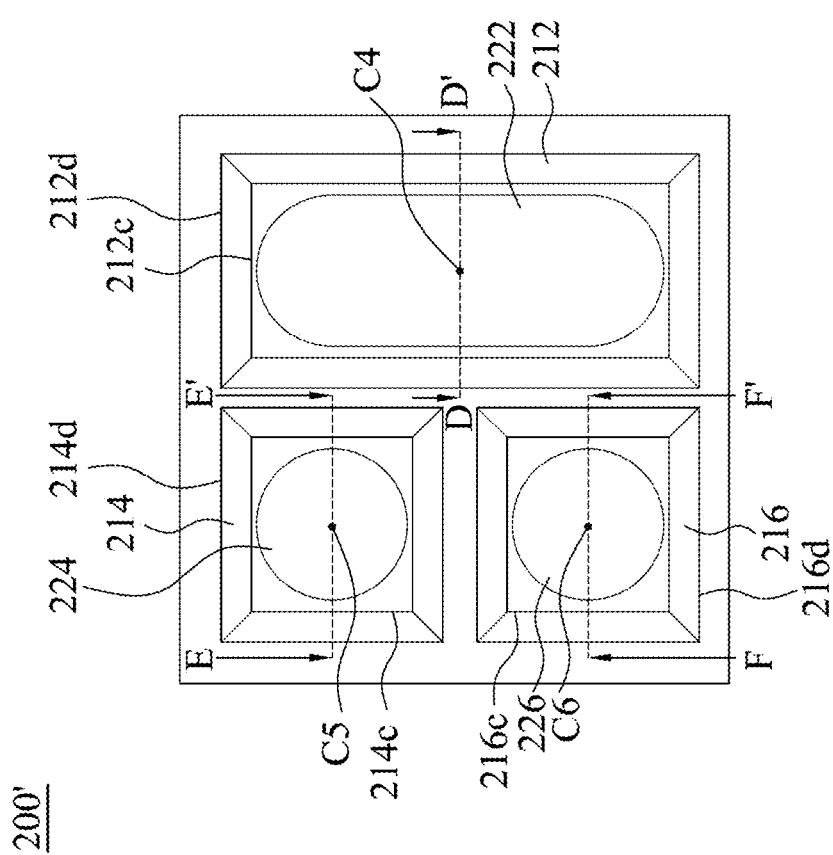
FIG. 7 is a top view of the micro LED structure in FIG. 6 in accordance with some embodiments of the present disclosure.
Figure 8:
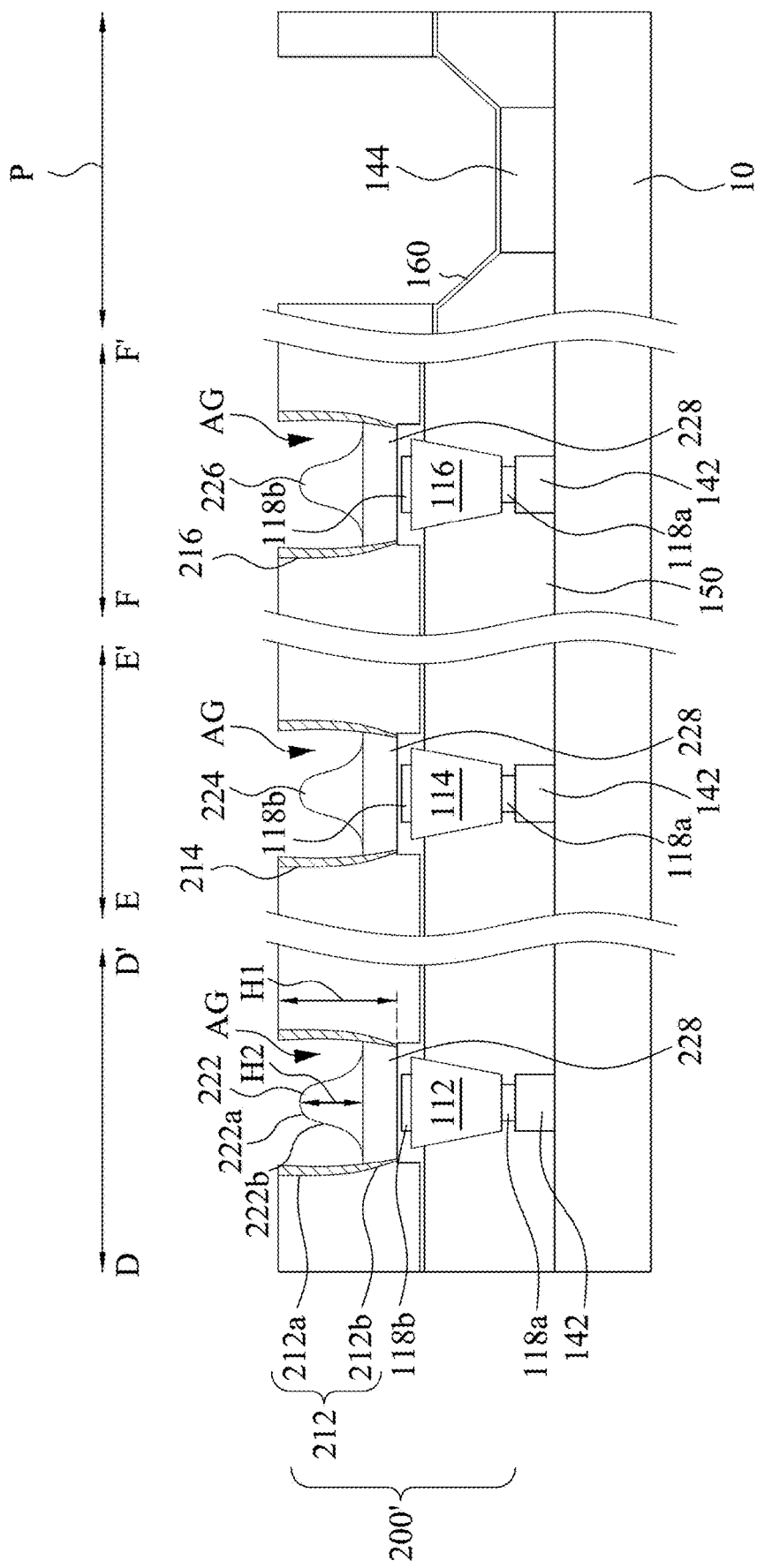
FIG. 8 is a cross-section view taken along line D-D', line E-E' and line F-F' in FIG. 7, a peripheral structure of the micro LED structure and the substrate in accordance with some embodiments of the present disclosure.

FIG. 6 is a perspective view of a micro LED structure 200' on a substrate 10 in accordance with some embodiments of the present disclosure, FIG. 7 is a top view of the micro LED structure 200' in FIG. 6 in accordance with some embodiments of the present disclosure, and FIG. 8 is a cross-section view taken along line D-D', line E-E' and line F-F' in FIG. 7, a peripheral structure P of the micro LED structure 200' and the substrate 10 in accordance with some embodiments of the present disclosure. In FIG. 8, the optical structures of the micro LED structure 200' includes a first lens 222, a second lens 224, a third lens 226, a first reflective cup 212, a second reflective cup 214 and a third reflective cup 216. The first lens 222, the second lens 224 and the third lens 226 are respectively disposed in the first reflective cup 212, the second reflective cup 214 and the third reflective cup 216 to further improve the light pattern. To evenly modified the light emitted from the first micro LED chip 112, the second micro LED chip 114 and the third micro LED chip 116, the first lens 222, the second lens 224 and the third lens 226 are placed at a center of the first reflective cup 212, a center of the second reflective cup 214 and a center of the third reflective cup 216 respectively. In other words, the first lens 222 is circular asymmetric about the center C4 of the first reflective cup 212, the second lens 224 is circular symmetric about the center C5 of the second reflective cup 214, and the third lens 226 is circular symmetric about the center C6 of the third reflective cup 216, as shown in FIG. 7. In some embodiments, an air gap AG is between the first reflective cup 212 and the first lens 222 (or between the second reflective cup 214 and the second lens 224, between the third reflective cup 216 and the third lens 226). In addition, transmission layers 228 are under the first lens 222, the second lens 224, the third lens 226 and in the first reflective cup 212, the second reflective cup 214 and the third reflective cup 216. The details of the transmission layers 228 are similar to or the same as the transmission layers 128.

The shapes of the first lens 222, the second lens 224 and the third lens 226 are similar to the first lens 122, the second lens 124 and the third lens 126. Take the first lens 222 as an example; the first lens 222 has a top portion 222a and a bottom portion 222b, which are similar to the top portion 122b and the bottom portion 122c (see FIG. 3C). The bottom portion 222b is between the top portion 222a and the first micro LED chip 112. In some embodiments, the top portion 212a of the sidewall of the first reflective cup 212 surrounds the top portion 222a of the first lens 222, and the bottom portion 212b of the sidewall of the first reflective cup 212 surrounds the bottom portion 222b of the first lens 222. The first reflective cup 212 and the first lens 222 have a height H1 and H2 respectively. A ratio of the height H2 to the height H1 may be adjusted based on different situations. In some embodiments, the ratio of the height H2 to the height H1 is in a range of about 0.5 to about 1. If the ratio of the height H2 to the height H1 is outside this range, the micro LED structure 200' may not provide a desired directional light profile.

Figure 9B:
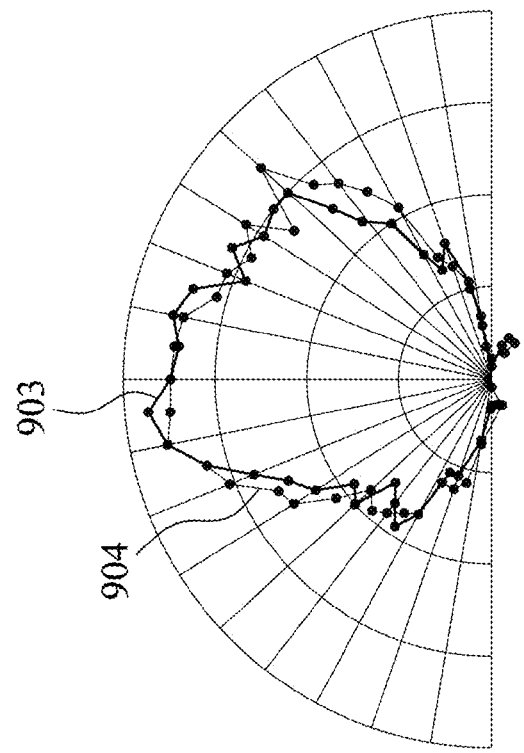
FIGS. 9A-9F are luminous intensity distribution diagrams with different micro LED structures in accordance with some embodiments of the present disclosure.
Figure 9A:
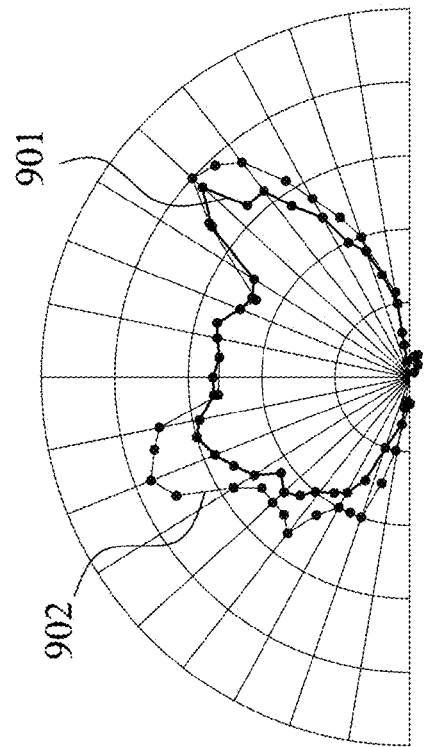
Figure 9D:
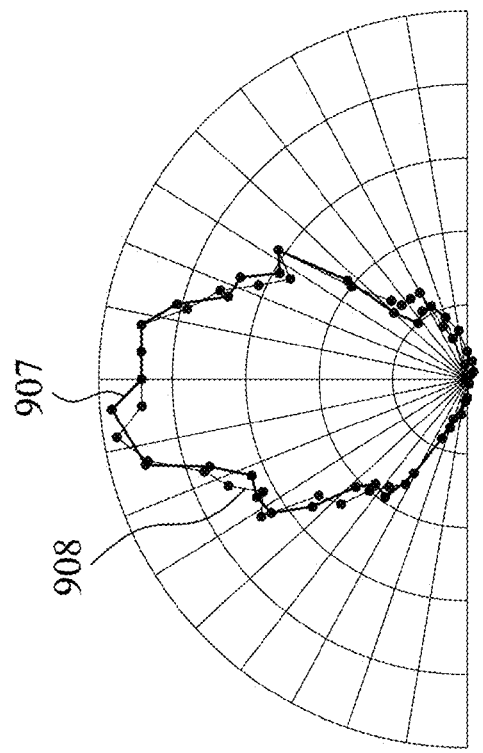
Figure 9C:
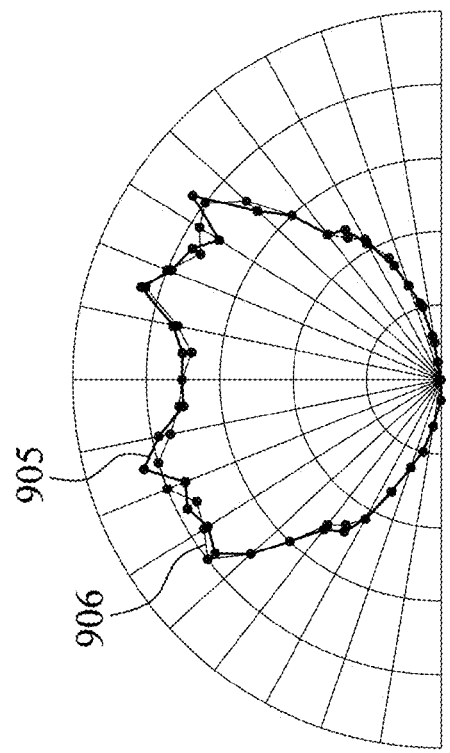
Figure 9F:
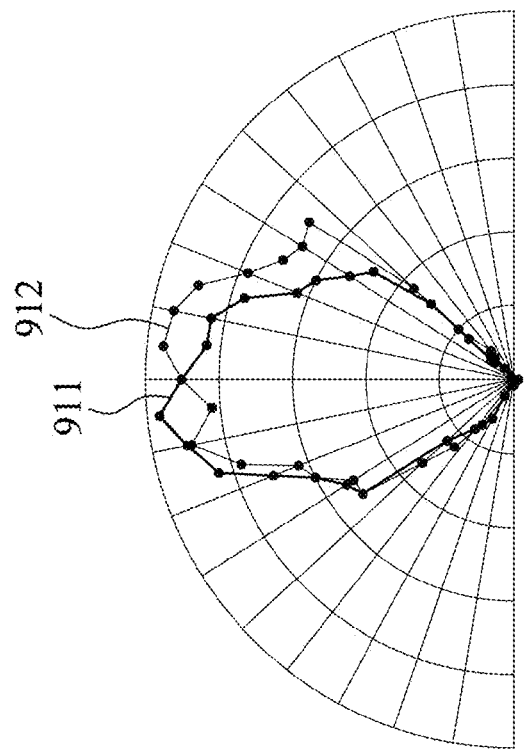
Figure 9E:
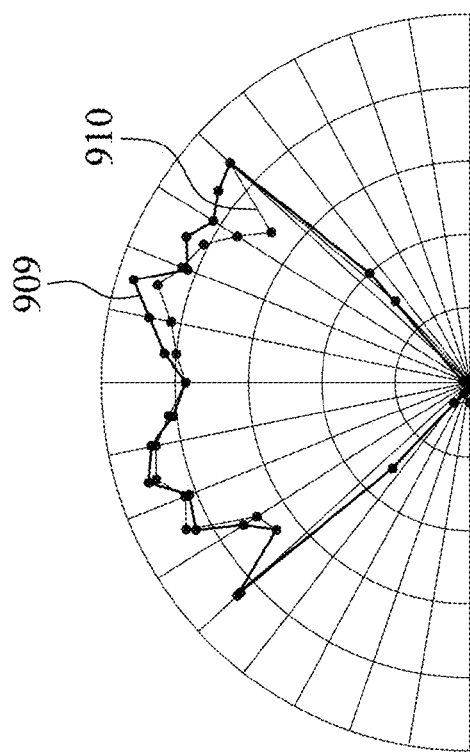

FIGS. 9A-9F are luminous intensity distribution diagrams with different micro LED structures in accordance with some embodiments of the present disclosure. FIG. 9A illustrates luminous intensity distribution curves 901 and 902 of structure 1, which only includes passivation layer around sidewalls of the micro LED chips. Curve 901 is the angular distribution in the y direction, and curve 902 is the angular distribution in the x direction. FIG. 9B illustrates luminous intensity distribution curves 903 and 904 of the light from structure 2, which is a micro LED structure with lenses (such as the first lens 122, the second lens 124 and the third lens 126) on the micro LED chips. Curve 903 is the angular distribution in the y direction, and curve 904 is the angular distribution in the x direction. FIG. 9C illustrates luminous intensity distribution curves 905 and 906 of the light from structure 3, which is the micro LED structure with reflective coating layers (such as reflective layers 120 or 120*a*) around the sidewalls of the semiconductor stacks of the micro LED chips. Curve 905 is the angular distribution in the y direction, and curve 906 is the angular distribution in the x direction. FIG. 9D illustrates luminous intensity distribution curves 907 and 908 of the light from structure 4 which is similar to structure 2. Curve 907 is the angular distribution in the y direction, and curve 908 is the angular distribution in the x direction. The difference between structure 2 and structure 4 is that structure 4 further includes reflective coating layers (such as reflective layers 120 or 120*a*) around the sidewalls of the semiconductor stacks of the micro LED chips, such as the micro LED structure 100. FIG. 9E illustrates luminous intensity distribution curves 909 and 910 of the light from structure 5, which is a micro LED structure with reflective cups (such as the first reflective cup 212, the second reflective cup 214 and the third reflective cup 216) over the micro LED chips and reflective coating layers (such as reflective coating layers 218) around the sidewalls of the semiconductor stacks of the micro LED chips, such as the micro LED structure 200. Curve 909 is the angular distribution in the y direction, and curve 910 is the angular distribution in the x direction. FIG. 9F illustrates luminous intensity distribution curves 911 and 912 of the light from structure 6 which is similar to structure 5. Curve 911 is the angular distribution in the y direction, and curve 912 is the angular distribution in the x direction. The difference between structure 5 and structure 6 is that structure 5, such as the micro LED structure 200', further includes lenses (such as the first lens 222, the second lens 224 and the third lens 226) in the reflective cups.

Figure 10A:
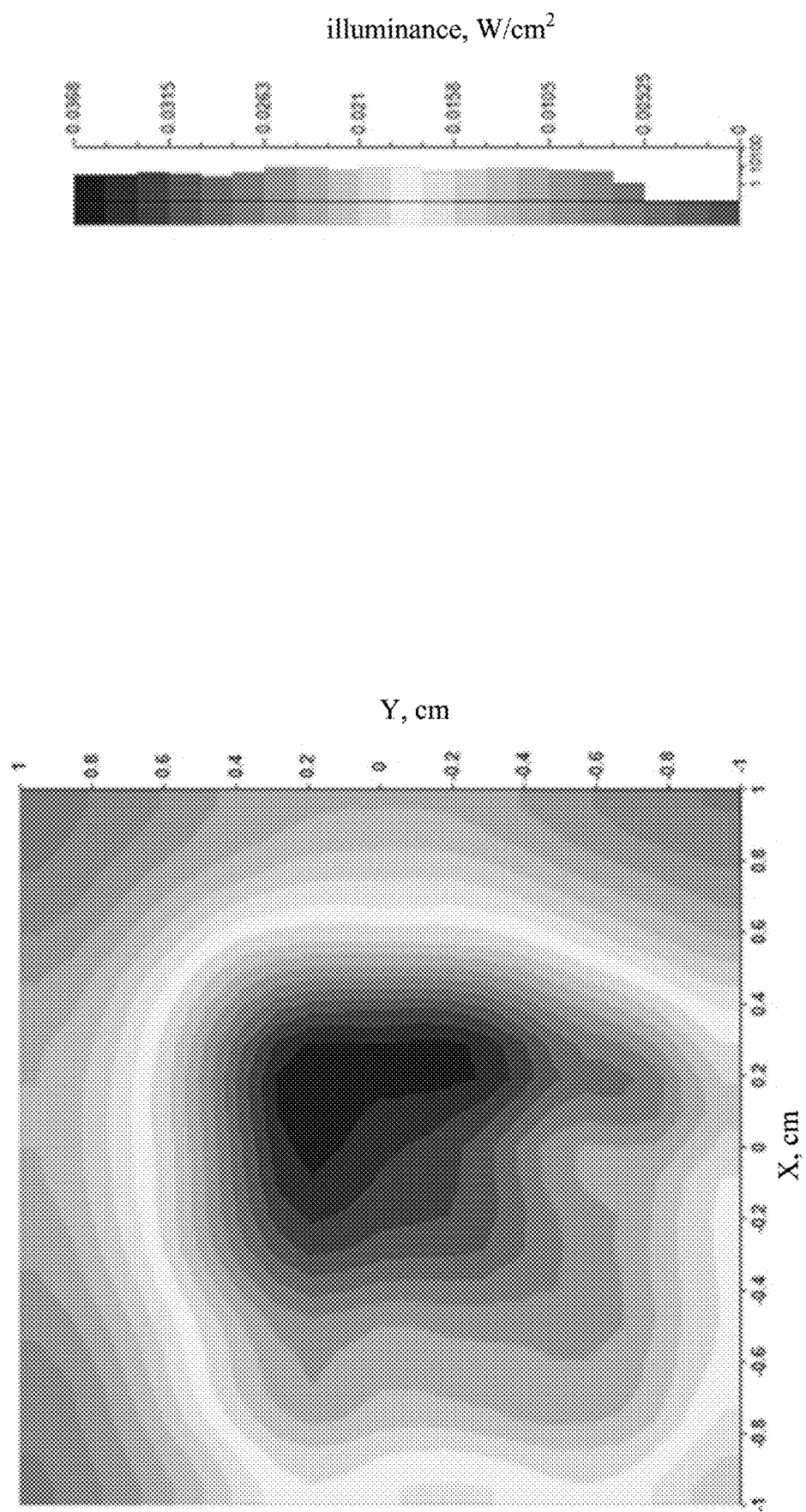
FIGS. 10A-10F are illuminance maps with different micro LED structures in accordance with some embodiments of the present disclosure.
Figure 10B:
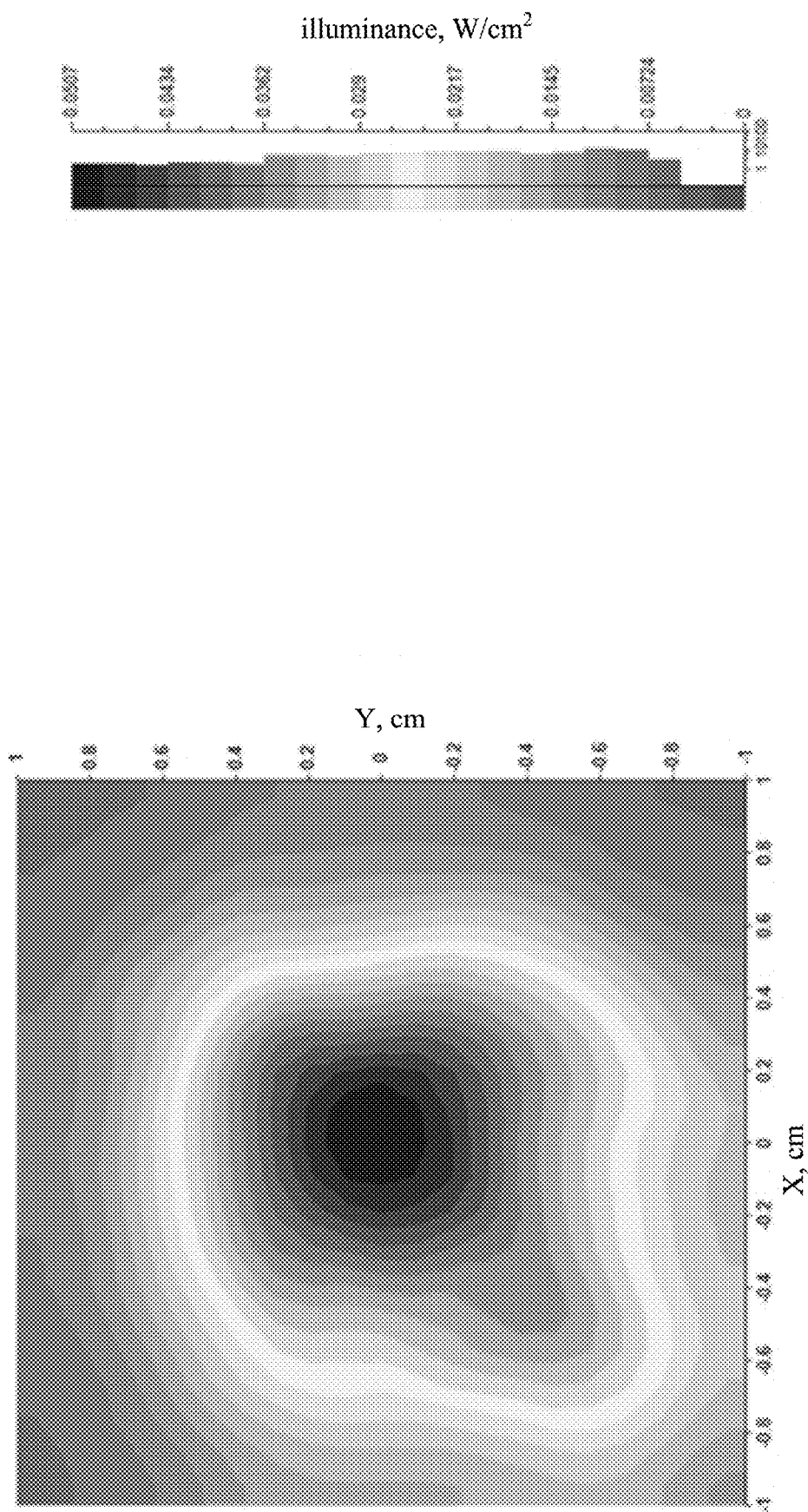
Figure 10C:
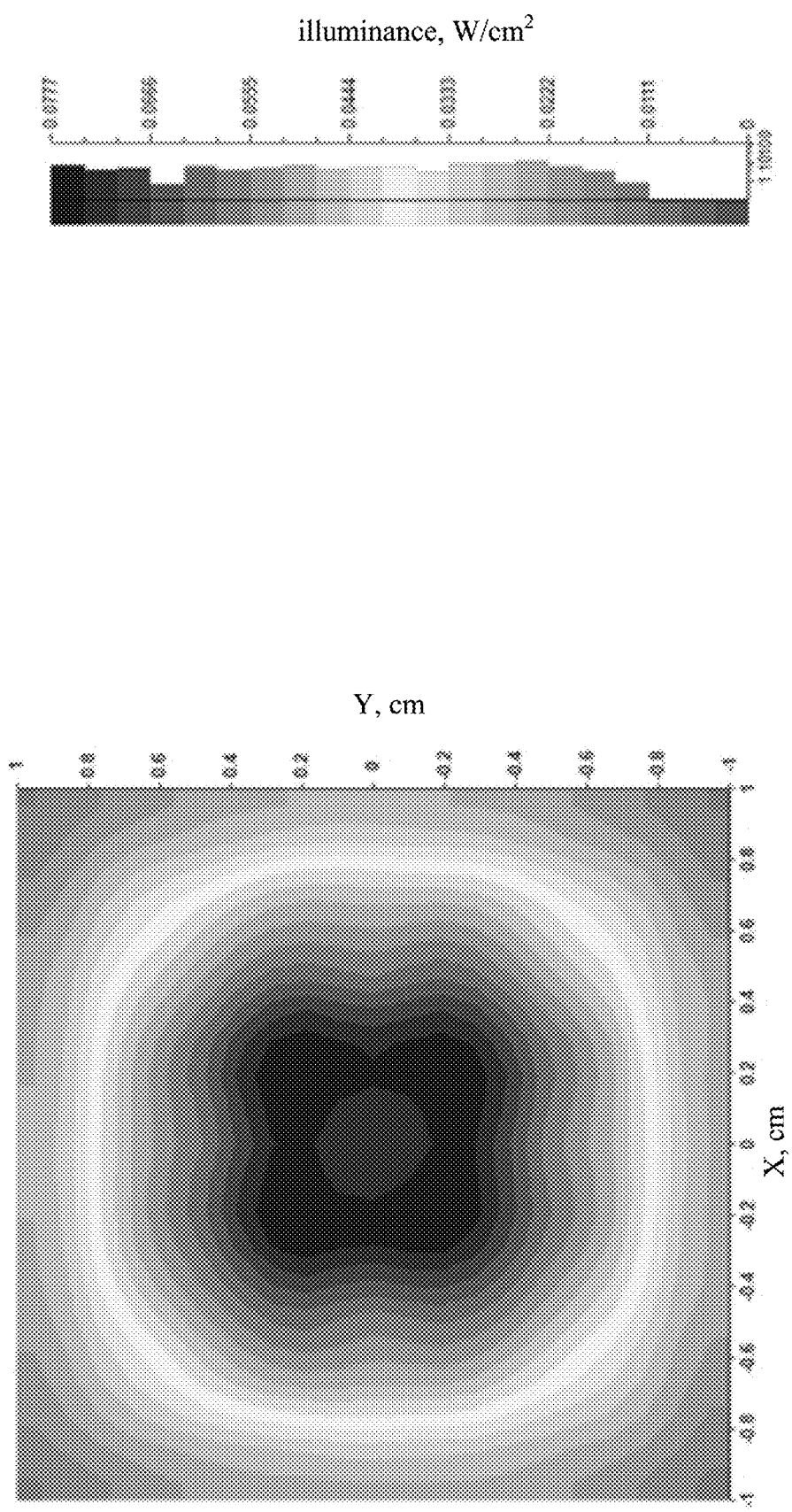
Figure 10D:
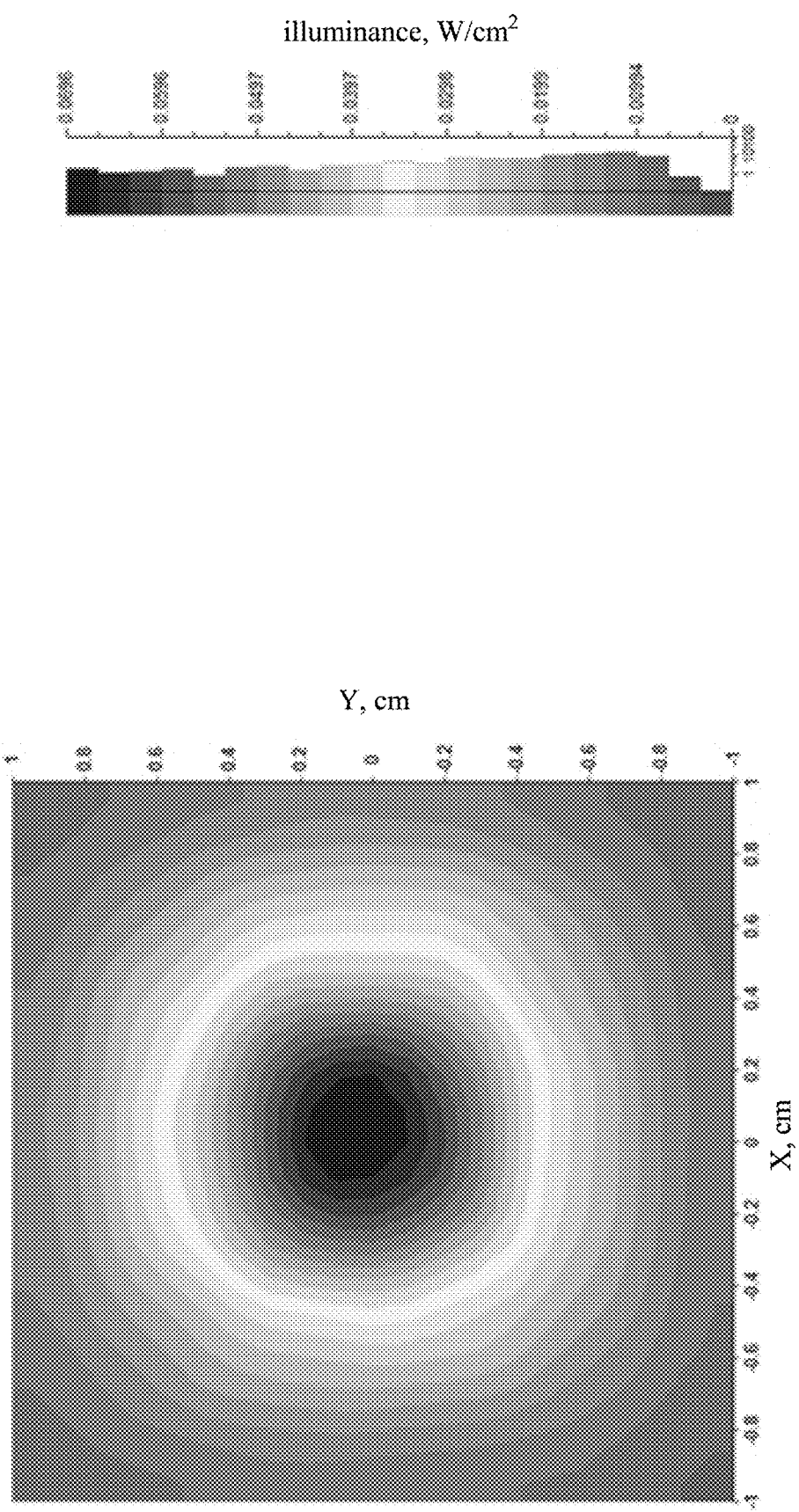
Figure 10E:
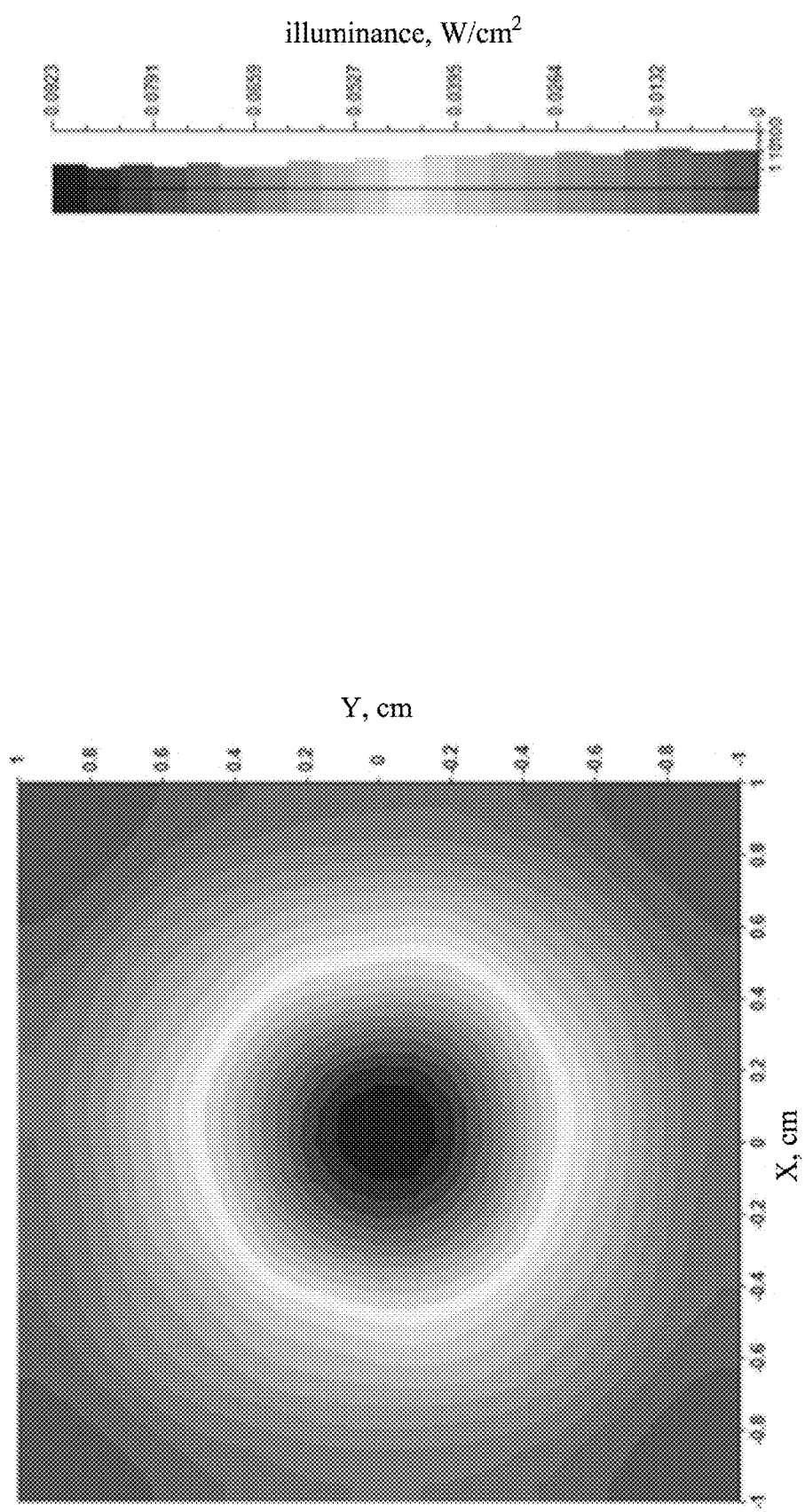
Figure 10F:
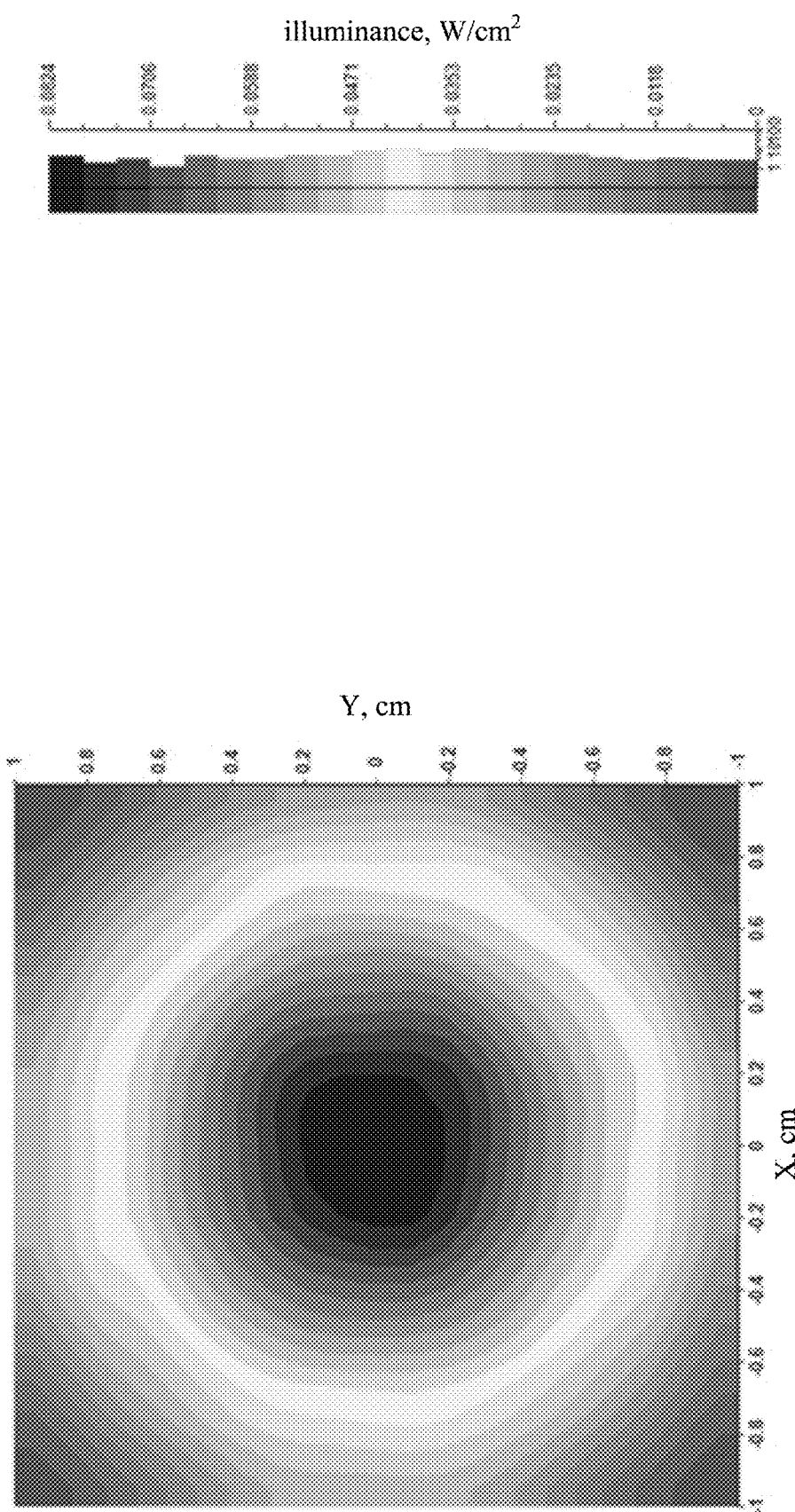

FIGS. 10A-10F are illuminance maps with different micro LED structures in accordance with some embodiments of the present disclosure. FIG. 10A is the illuminance map of structure 1. FIG. 10B is the illuminance map of structure 2. FIG. 10C is the illuminance map of structure 3. FIG. 10D is the illuminance map of structure 4. FIG. 10E is the illuminance map of structure 5, and FIG. 10F is the illuminance map of structure 6. FIG. 11 illustrates data related to performances of different micro LED structures in accordance with some embodiments of the present disclosure. According to FIGS. 10A-10F and FIG. 11, it is observed that in structure 4, structure 5 and structure 6, the beam angles are reduced to less than 90°, the light intensity increases near the center point (i.e. where angle is 0) and the distributions become even. With such improvement, the micro LED structures are more suitable for AR/VR devices.

Figure 12:
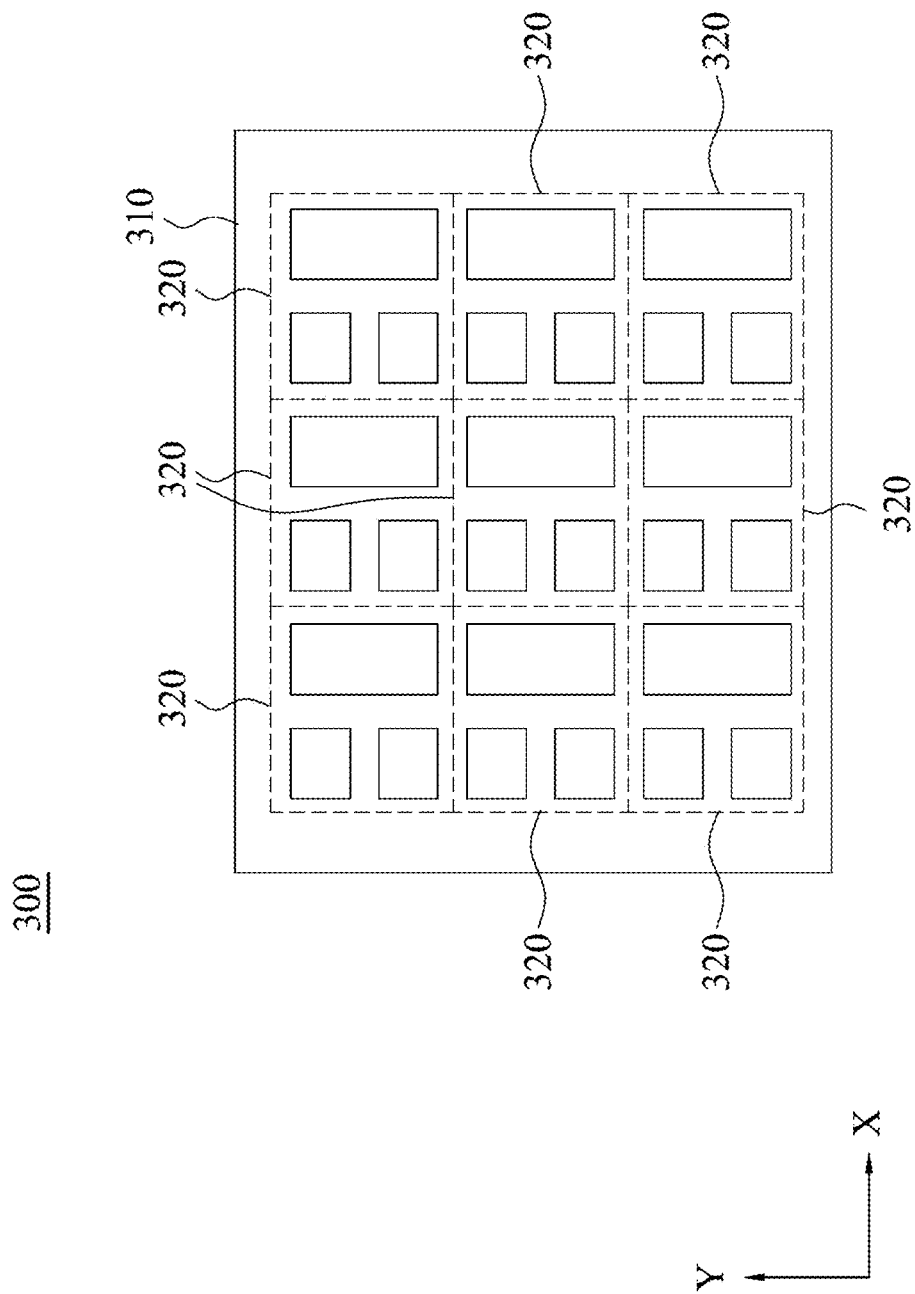
FIG. 12 is a top view of a display device in accordance with some embodiments of the present disclosure.

FIG. 12 is a top view of a display device 300 in accordance with some embodiments of the present disclosure. In the display device 300, multiple micro LED structures 320 are arranged on a substrate 310 and at least in a first direction X. The substrate 310 is similar to or the same as the substrate 10 (see FIG. 3B). In some embodiments, the micro LED structures 320 are also arranged in a second direction Y substantially perpendicular to the first direction X. The micro LED structures 320 may be any aforementioned micro LED structures, such as the micro structures 100, 200, or 200'. The resulting display device 300 may be further used in AR/VR applications.

The present disclosure provides some advantages. In some embodiments, the improved micro LED structures including the optical structures (such as lenses, reflective cup, combinations thereof) over the micro LED chips reduce the beam angle and increase intensity of the light emitted from the micro LED chips. Moreover, an even distribution of the light emitted from the micro LED chips is obtained. In some embodiments, the improved micro LED structures further include reflective coating layers wrapping around the semiconductor stack to further increase directivity of light of the micro LED structures. The display device using the improved micro LED structures provides better performance with these advantages.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A micro LED structure, comprising:
a first micro LED chip having opposite first and second sides;
a second micro LED chip adjacent to the first side of the first micro LED chip;
a third micro LED chip adjacent to the first side of the first micro LED chip, wherein each of the first micro LED chip, the second micro LED chip and the third micro LED chip comprises:
a semiconductor stack comprising a first semiconductor layer, an active layer in contact with the first semiconductor layer, and a second semiconductor layer in contact with the active layer;
a metal pad in contact with the first semiconductor layer; and
a reflective coating layer disposed around sidewalls of the semiconductor stack;
optical structures respectively over the first micro LED chip, the second micro LED chip and the third micro LED chip; and
a planarization layer surrounding the first micro LED, the second micro LED and the third micro LED.

2. The micro LED structure of claim 1, wherein the optical structures comprises:
a first lens over the first micro LED chip;
a second lens over the second micro LED chip; and
a third lens over the third micro LED chip.

3. The micro LED structure of claim 2, wherein the first lens is circular asymmetric about a center of the first lens, the second lens is circular symmetric about a center of the second lens, and the third lens is circular symmetric about a center of the third lens.

4. The micro LED structure of claim 3, wherein from a cross-section view, each of the first lens, the second lens and the third lens has a top portion and a bottom portion, and the top portion has a convex sidewall and the bottom portion has a concave sidewall.

5. The micro LED structure of claim 3, wherein a first common external tangent of the first lens and the second lens is substantially perpendicular to a lengthwise direction of the first lens, and a second common external tangent of the first lens and the third lens is substantially perpendicular to the lengthwise direction of the first lens.

6. The micro LED structure of claim 3, further comprising a transmission layer between the first lens and the first micro LED chip.

7. The micro LED structure of claim 6, wherein the transmission layer is transparent.

8. The micro LED structure of claim 6, wherein a material of the transmission layer is the same as a material of the first lens.

9. The micro LED structure of claim 1, wherein the optical structures comprise:
    a first reflective cup over the first micro LED chip;
    a second reflective cup over the second micro LED chip; and
    a third reflective cup over the third micro LED chip.

10. The micro LED structure of claim 9, wherein an area of a bottom opening of the first reflective cup is about a sum of an area of a bottom opening of the second reflective cup and an area of a bottom opening of the third reflective cup.

11. The micro LED structure of claim 9, wherein the optical structures further comprises:
    a first lens disposed in the first reflective cup;
    a second lens disposed in the second reflective cup; and
    a third lens disposed in the third reflective cup.

12. The micro LED structure of claim 11, wherein the first lens is circular asymmetric about a center of the first reflective cup, the second lens is circular symmetric about a center of the second reflective cup, and the third lens is circular symmetric about a center of the third reflective cup.

13. The micro LED structure of claim 11, wherein an air gap is between the first reflective cup and the first lens.

14. The micro LED structure of claim 11, wherein a ratio of a height of the first lens to a height of the first reflective cup is greater than about 0.5 and less than about 1.

15. The micro LED structure of claim 11, wherein:
    the first lens comprises a top portion and a bottom portion between the top portion and the first micro LED chip,
    the first reflective cup comprises a top portion surrounding the top portion of the first lens and a bottom portion surrounding the bottom portion of the first lens, and
    a sidewall of the top portion of the first reflective cup has a slope different from a slope of a sidewall of the bottom portion of the first reflective cup.

16. The micro LED structure of claim 9, wherein the first reflective cup is rectangular from a top view, and the second reflective cup and the third reflective cup are square from the top view.

17. The micro LED structure of claim 16, wherein each of the first reflective cup, second reflective cup and the third reflective cup has curved inner sidewalls.

18. The micro LED structure of claim 17, wherein the curved inner sidewalls are concave.

19. The micro LED structure of claim 17, wherein the curved inner sidewall of first reflective cup has a top portion and a bottom portion, and the bottom portion of the curved inner sidewall is more slanted than that of the top portion of the curved inner sidewall.

\* \* \* \* \*